(12) United States Patent
Oikawa et al.

(10) Patent No.: US 8,226,771 B2
(45) Date of Patent: Jul. 24, 2012

(54) SUBSTRATE PROCESSING APPARATUS AND SUBSTRATE PROCESSING METHOD

(75) Inventors: Fumitoshi Oikawa, Tokyo (JP); Shinji Kajita, Tokyo (JP)

(73) Assignee: Ebara Corporation, Tokyo (JP)

( * ) Notice: Subject to any disclaimer, the term of this patent is extended or adjusted under 35 U.S.C. 154(b) by 614 days.

(21) Appl. No.: 12/225,241

(22) PCT Filed: Mar. 6, 2007

(86) PCT No.: PCT/JP2007/054334
§ 371 (c)(1),
(2), (4) Date: Jul. 31, 2009

(87) PCT Pub. No.: WO2007/108315
PCT Pub. Date: Sep. 27, 2007

(65) Prior Publication Data
US 2009/0301518 A1  Dec. 10, 2009

(30) Foreign Application Priority Data

Mar. 22, 2006  (JP) .................................. 2006-078822

(51) Int. Cl.
*B08B 3/12* (2006.01)
*B08B 11/02* (2006.01)

(52) U.S. Cl. .......................................... 134/1.3; 15/102

(58) Field of Classification Search ............... 15/77, 102
See application file for complete search history.

(56) References Cited

U.S. PATENT DOCUMENTS

| | | | |
|---|---|---|---|
| 2002/0092544 A1 | 7/2002 | Namba | |
| 2002/0189641 A1* | 12/2002 | Sato | .................. 134/6 |
| 2004/0261944 A1 | 12/2004 | Wakabayashi et al. | |
| 2006/0234503 A1 | 10/2006 | Yamada et al. | |

FOREIGN PATENT DOCUMENTS

| | | |
|---|---|---|
| JP | 2002-66467 | 3/2002 |
| JP | 2003-22993 | 1/2003 |
| JP | 2003-163195 | 6/2003 |
| JP | 2003-309089 | 10/2003 |
| JP | 2004-235559 | 8/2004 |
| WO | 2005/015627 | 2/2005 |

OTHER PUBLICATIONS

International Search Report issued Jun. 5, 2007 in the International (PCT) Application of which the present application is the U.S. National Stage.
Japanese Office Action (and partial English translation) issued Mar. 6, 2012 in corresponding Japanese Application No. 2008-506223.
Supplementary European Search Report issued Nov. 21, 2011 in European Patent Application No. EP 07 73 7881.

\* cited by examiner

*Primary Examiner* — Randall Chin
(74) *Attorney, Agent, or Firm* — Wenderoth, Lind & Ponack, L.L.P.

(57) ABSTRACT

A substrate processing apparatus includes: a polishing device 30A for polishing the surface of a substrate; and at least one of an ultrasonic cleaning device 42 for cleaning the surface of the substrate with ultrasonic waves transmitted through a liquid, and a two-fluid jet cleaning device 44 for cleaning the surface of the substrate with a two-fluid jet spouted as a mixture of a gas and a liquid. A substrate processing method includes: a polishing step of polishing the surface of a substrate; and a solid matter noncontact cleaning step of cleaning the surface of the substrate by spraying a liquid to the surface of the substrate. The above apparatus and method make it possible to efficiently clean the surface of a substrate after it is polished.

11 Claims, 8 Drawing Sheets

SUBSTRATE PROCESSING APPARATUS AND SUBSTRATE PROCESSING METHOD

TECHNICAL FIELD

This invention relates to a substrate processing apparatus and a substrate processing method, and specifically relates to such apparatus and method that make it possible to efficiently clean substrates after they are polished.

BACKGROUND ART

Improvements in manufacturing technology for semiconductor devices in recent years have been remarkable. As semiconductor devices are made with ever higher degree of integration, circuit wiring becomes finer and spacing between wires becomes narrower. Amid such circumstances, semiconductor substrates are required to be made flat. As a means for flattening semiconductor substrates, a polishing apparatus is known that carries out chemical mechanical polishing (CMP). Since polishing apparatuses include many components, they tend to be large in overall size. Therefore, considerable amount of time has been taken to transport substrates to the components suitable for carrying out various steps. Under such circumstances, attempts are being made, on one hand, to produce a polishing apparatus that is compact and can efficiently transport objects to be polished. On the other hand, cleaning of substrates after polishing has been carried out mainly as scrub cleaning using sponges of roll-like or hemispherical shape (See for example the Patent Document 1).

[Patent Document 1]
JP-A 2003-309089 (paragraph 0129, etc.)

SUMMARY OF INVENTION

Problems to be Solved by the Invention

However, under the circumstances of circuit wiring becoming further minute along with demands for making semiconductor devices with higher degree of integration, today when the presence of finer particles becomes a problem, there have been the following problems in using the sponge as a main cleaning means for cleaning substrates. That is to say, the initializing time, in which dust production from the sponge itself is held back to the extent of no influence on the substrate, tends to increase, which lowers the operating rate of the apparatus. Besides, it is possible that dust of the sponge itself continuously produced also after the initialization adheres to the substrate or that minute particles removed with the sponge adhere again to the substrate.

In view of the above problems, an object of the invention is to provide a substrate processing apparatus and a substrate processing method for making it possible to efficiently clean a surface of a substrate after it is polished.

Means for Solving the Problem

To achieve the above object, according to aspect (1) of the present invention, referring to FIG. 1, for example, a substrate processing apparatus comprises a polishing device 30A for polishing a surface of a substrate; and at least one of an ultrasonic cleaning device 42 (refer to FIG. 2, for example) for cleaning the surface of the substrate with ultrasonic waves transmitted through a liquid, and a two-fluid jet cleaning device 44 (see FIG. 5, for example) for cleaning the surface of the substrate with a two-fluid jet spouted as a mixture of a gas and a liquid.

The above constitution includes at least one of the ultrasonic cleaning device that cleans the surface of the substrate with ultrasonic waves transmitted through the liquid, and the two-fluid jet cleaning device that mixes gas and liquid together and spouts them as the two-fluid jet for cleaning the surface of the substrate. As a result, minute particles are removed with the fluid, and the substrate processing apparatus is made capable of cleaning the substrate without taking an initializing time while preventing dust from adhering to the substrate.

According to aspect (2) of the present invention, as shown in FIG. 2, for example, the substrate processing apparatus according to aspect (1) comprises at least the ultrasonic cleaning device 42. preferably, the ultrasonic cleaning device 42 includes an ultrasonic emitter 422 covering a radius of the substrate W.

With the above constitution, because the ultrasonic cleaning device includes the ultrasonic emitter covering the radius of the substrate, the entire substrate may be cleaned by simply rotating the substrate within the horizontal plane without moving the ultrasonic emitter.

According to aspect (3) of the present invention, as shown in FIG. 2, for example, in the substrate processing apparatus according to aspect (2), preferably, the ultrasonic emitter 422 includes a first surface 422A disposed to face the surface WA of the substrate W and covering the radius of the substrate W, a second surface 422B attached with a vibrating element 426 for producing the ultrasonic waves, and a third surface 422C adjacent to the first and second surfaces 422A and 422B, and the first, second, and third surfaces 422A, 422B, and 422C form a generally triangular column.

With the above constitution, because the first, second and third surfaces are disposed to form a generally triangular column, the ultrasonic vibration may be given to the substrate substantially free from mutual reinforcement or neutralization between vibration waves emitted from the vibration element and reflected waves.

According to aspect (4) of the present invention, as shown in FIG. 7, for example, in the substrate processing apparatus according to the aspect (2), preferably, the ultrasonic emitter 522 includes an ultrasonic emitting surface 522A disposed to face the surface WA of the substrate W and covering the radius of the substrate W, and the ultrasonic emitting surface 522A is formed in a generally triangular shape.

With the above constitution, when the disk-shaped substrate is cleaned with ultrasonic waves in case that the substrate is rotated in the horizontal plane, ultrasonic energy may be given substantially evenly to the surface of the substrate.

According to aspect (5) of the present invention, as shown in FIG. 7, for example, in the substrate processing apparatus according to aspect (2), preferably, the ultrasonic emitter 522 includes a first surface 522A disposed to face the surface WA of the substrate W and covering the radius of the substrate W, and a vibrating element 526 for producing the ultrasonic waves disposed either on the first surface 522A or in a position more distant from the surface WA of the substrate W to the vibrating element 526 than from the surface WA of the substrate W to the first surface 522A, and a vibrating element surface of the vibrating element 526 nearest to the surface WA of the substrate W is in parallel with the surface WA of the substrate W.

With the above constitution, time and effort for manufacturing the ultrasonic emitter may be alleviated.

According to aspect (6) of the present invention, as shown in FIGS. 1, 2, and 5, for example, the substrate processing apparatus according to any one of aspect (1) to aspect (5) comprises both the ultrasonic cleaning device 42 and the two-fluid jet cleaning device 44. Preferably, the ultrasonic cleaning device 42 includes an ultrasonic cleaning rotating mechanism 421 for holding and rotating the substrate W in a horizontal plane, the two-fluid jet cleaning device 44 includes a two-fluid jet cleaning rotating mechanism 441 for holding and rotating the substrate W in a horizontal plane, and the substrate processing apparatus 100 further comprises a control device 9 for controlling the ultrasonic cleaning rotating mechanism 421 and the two-fluid jet cleaning rotating mechanism 441 so that a rotating speed of the substrate W being cleaned with the ultrasonic waves is lower than that of the substrate W being cleaned with the two-fluid jet.

With the above constitution, because the control device is provided to control both the ultrasonic cleaning rotating mechanism and the two-fluid jet cleaning rotating mechanism so that the rotating speed of the substrate being cleaned with the ultrasonic waves is lower than the rotating speed of the substrate being cleaned with the two-fluid jet, it becomes easy to retain liquid film between the ultrasonic emitter and the substrate. When the substrate is cleaned with two-fluid jet, cleaning time may be shortened.

According to aspect (7) of the present invention, as shown in FIGS. 1 and 4, for example, the substrate processing apparatus according to any one of aspect (1) to aspect (6) comprises a scrub cleaning device 43 for cleaning the surface WA of the substrate W by scrubbing it with a scrubbing piece 432. Here, the "scrubbing piece" is a solid matter (such as a sponge) for scrubbing the surface of the substrate.

With the above constitution, at least one of the ultrasonic cleaning device and the two-fluid jet cleaning device, and the scrub cleaning device may be selectively used according to the progress in the cleaning step, so that cleaning is made efficiently.

To achieve the above object, according to aspect (8) of the present invention, a substrate processing method comprises a polishing step of polishing a surface of a substrate; and a solid matter noncontact cleaning step of cleaning the surface of the substrate while keeping the surface of the substrate in contact with a fluid. Here, the "solid matter noncontact cleaning step" is a step of cleaning the surface of the substrate without bringing a solid matter (such as a scrubbing piece, for example) into contact with the surface of the substrate.

With the above constitution, because the substrate processing method includes the solid matter noncontact cleaning step of cleaning the surface of the substrate while bringing fluid into contact with the surface of the substrate, minute particles are removed with the fluid, making it possible to clean the surface of the substrate without taking an initializing time and without causing dust adhering to the substrate.

According to aspect (9) of the present invention, in the substrate processing method according to aspect (8), preferably, the solid matter noncontact cleaning step includes at least one of an ultrasonic cleaning step of cleaning the substrate, while it is being rotated in a horizontal plane, by casting ultrasonic waves over an area covering a radius of the substrate, and a two-fluid jet cleaning step of cleaning the substrate, while it is being rotated in a horizontal plane, by spraying a mist, spouted as a mixture of a gas and a liquid, to the substrate.

With the above constitution, the surface of the substrate may be cleaned with at least one of the ultrasonic energy and the mist jet, resulting in cleaning without contaminating the substrate.

According to aspect (10) of the present invention, the substrate processing method according to aspect (8) or aspect (9) comprises a scrub cleaning step of cleaning the surface of the substrate by scrubbing it with a scrubbing piece. preferably, the scrub cleaning step is followed by the solid matter noncontact cleaning step.

With the above constitution, the scrub cleaning step is taken first, followed by the solid matter noncontact cleaning step. Therefore, the substrate is cleaned with high cleaning effect in the scrub cleaning step followed by the solid matter noncontact cleaning step, so that the substrate is thoroughly cleaned down to its recessed parts, making it possible to shorten cleaning time while maintaining high cleaning capability.

According to aspect (11) of the present invention, in the substrate processing method according to aspect (9) or aspect (10), preferably, the solid matter noncontact cleaning step includes both the ultrasonic cleaning step and the two-fluid jet cleaning step, and a rotating speed of the substrate in the ultrasonic cleaning step is lower than that of the substrate in the two-fluid jet cleaning step.

With the above constitution, liquid film is easily retained during ultrasonic cleaning, and the substrate cleaning with the two-fluid jet can shorten cleaning time.

According to aspect (12) of the present invention, in the substrate processing method according to any one of aspect (8) to aspect (11), preferably, the substrate is formed with a recess with a width between 0.5 micrometers and 2.0 micrometers.

With the above constitution, dust in the recesses formed in the substrate for mutual positioning, etc. is removed, positioning accuracy is improved, and the yield in substrate manufacture is improved.

According to aspect (13) of the present invention, in the substrate processing method according to any one of aspect (8) to aspect (11), preferably, the substrate is formed with a recess with a width between 10 nanometers and 50 nanometers and with a depth between 10 nanometers and 100 nanometers.

With the above constitution, dust in the recesses formed in the step of polishing the surface of the substrate is removed and the yield in substrate manufacture is improved.

This application is based on the Patent Applications No. 2006-078822 filed on Mar. 22, 2006 in Japan, the contents of which are hereby incorporated in its entirety by reference into the present application, as part thereof.

The present invention will become more fully understood from the detailed description given hereinbelow. However, the detailed description and the specific embodiment are illustrated of desired embodiments of the present invention and are described only for the purpose of explanation. Various changes and modifications will be apparent to those ordinary skilled in the art on the basis of the detailed description.

The applicant has no intention to give to public any disclosed embodiment. Among the disclosed changes and modifications, those which may not literally fall within the scope of the patent claims constitute, therefore, a part of the present invention in the sense of doctrine of equivalents.

The use of the terms "a" and "an" and "the" and similar referents in the context of describing the invention (especially in the context of the following claims) are to be construed to cover both the singular and the plural, unless otherwise indicated herein or clearly contradicted by context. The use of any and all examples, or exemplary language (e.g., "such as") provided herein, is intended merely to better illuminate the invention and does not pose a limitation on the scope of the invention unless otherwise claimed.

EFFECT OF THE INVENTION

The substrate processing apparatus according to the present invention includes at least one of the ultrasonic cleaning device that cleans the surface of the substrate with ultrasonic waves transmitted through the liquid, and the two-fluid jet cleaning device that mixes gas and liquid together and spouts them as the two-fluid jet for cleaning the surface of the substrate. As a result, minute particles are removed with the fluid, and the substrate processing apparatus is made capable of cleaning the substrate without taking an initializing time while preventing dust from adhering to the substrate.

The substrate processing method according to the present invention includes the solid matter noncontact cleaning step of cleaning the surface of the substrate while bringing fluid into contact with the surface of the substrate, minute particles are removed with the fluid, making it possible to clean the surface of the substrate without taking an initializing time and without causing dust adhering to the substrate.

DESCRIPTION OF REFERENCE NUMERALS AND SYMBOLS

Figure 1:
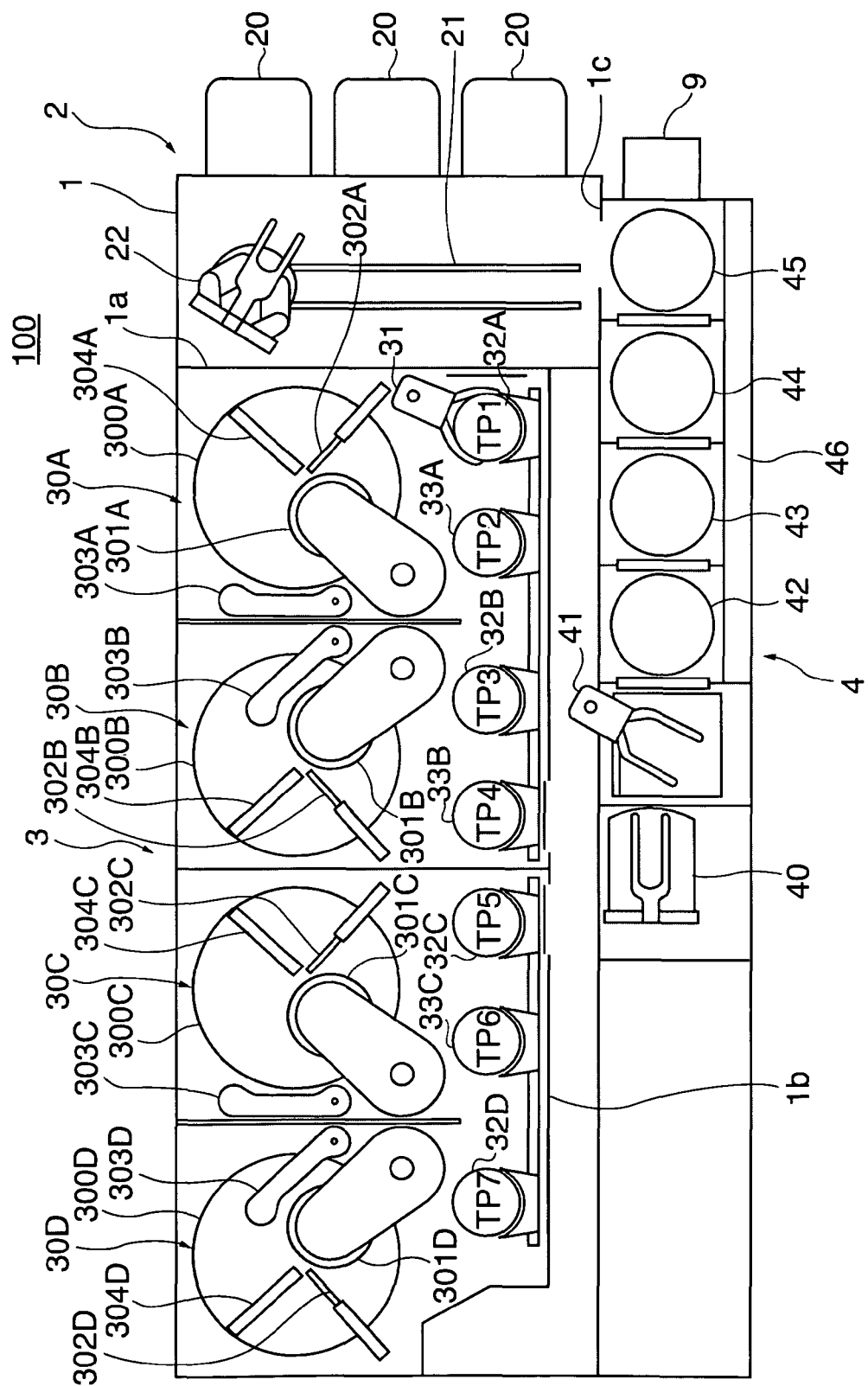
FIG. 1 is a plan view of the overall constitution of a substrate processing apparatus as an embodiment of the present invention.

3: polishing apparatus
42: ultrasonic cleaner
421: rotary support member (ultrasonic cleaning rotating mechanism)
422: ultrasonic emitter
422A: emitting surface (first surface)
422B: vibrating surface (second surface)
422C: top surface (third surface)
426: vibrating element
43: scrub cleaning device
432: roll sponge (scrubbing piece)
44: two-fluid jet cleaning device
441: rotary chuck (two-fluid jet cleaning rotating mechanism)
52: ultrasonic cleaner
522: ultrasonic emitter
522A: ultrasonic emitting surface (first surface)
526: vibrating element
100: substrate processing apparatus
W: substrate
WA: surface of the substrate

DETAILED DESCRIPTION OF THE INVENTION

Embodiments of the present invention will be hereinafter described in reference to the appended drawings. In the drawings, the same or like components are provided with the same or like reference numerals and symbols, without duplicate description.

FIG. 1 is a plan view of the overall constitution of a substrate processing apparatus 100 as an embodiment of the present invention. The substrate processing apparatus 100 includes a generally rectangular housing 1. The interior of the housing 1 is provided with: a loading/unloading section 2 divided with partition walls 1a, 1b, and 1c; a polishing section 3 for polishing substrates, and a cleaning section 4 for cleaning the polished substrates. The loading/unloading section 2, the polishing section 3, and the cleaning section 4 are assembled independently of each other and constituted to be ventilated independently. The substrate processing apparatus 100 also includes a control device 9.

The loading/unloading section 2 has wafer cassettes 20 for stocking substrates, and a transfer robot 22 for transferring a substrate from the wafer cassette 20 to the polishing section 3, or from the cleaning section 4 to the wafer cassette 20. The transfer robot 22 has an upper hand and a lower hand. The hands are constituted to be used selectively. For example, the upper hand is used to transfer a substrate back to the wafer cassette 20, and the lower hand is used to transfer a substrate yet to be polished. Because the loading/unloading section 2 is required of maintaining the cleanest state, its internal pressure is constantly maintained to be higher than the pressure in any of the exterior of the apparatus, the polishing section 3, and the cleaning section 4. A fan filter unit (not shown) having high performance filter such as an HEPA filter (High Efficiency Particulate Air filter) is provided above a running mechanism 21 of the transfer robot 22. A clean air down-flow, with particles, etc. of a predetermined grain diameter (particles causing contamination) removed, is formed in the loading/unloading section 2.

The polishing section 3 has four polishing devices 30A, 30B, 30C, and 30D, substantially the same in constitution. The polishing device 30A has: a polishing table 300A having a polishing surface, a top ring 301A capable of both holding a substrate and pressing it against the polishing table 300A, a polishing liquid supply nozzle 302A for supplying dressing liquid (such as water) and polishing liquid such as slurry to the polishing table 300A, a dresser 303A for dressing the polishing table 300A, and an atomizer 304A for atomizing fluid mixture of liquid (such as pure water) and gas (such as nitrogen) and spraying it through one or a plurality of nozzles to the polishing surfaces. The polishing device 30A also has: a reverser 31 capable of receiving a substrate from the transfer robot 22 of the loading/unloading section 2 and of turning it upside down; a lifter 32A located in the first transfer position TP1 and capable of moving up and down, and a pusher 33A located in the second transfer position TP2 and capable of moving up and down.

To the top surface of the polishing table 300A, a polishing cloth or a whetstone is attached, so that the polishing surface for polishing substrates is constituted with the polishing cloth or the whetstone. The polishing table 300A is made to rotate at a predetermined rotating speed by a means such as an electric motor. The top ring 301A is provided with a plurality of holes penetrating through its surface opposing the polishing table 300A, so that gas may flow through inside and outside the top ring 301A. It is constituted that, when the top ring 301A is to hold a substrate, the substrate is suctioned by evacuating the interior of the top ring 301A; and when the top ring 301A is to press the substrate against the polishing table 300A, the substrate is pressed by making the interior of the top ring 301A to a positive pressure. Also, when the substrate is to be released from the top ring 301A toward the pusher 33A, etc., the release is made easily by making the interior of the top ring 301A to a positive pressure. The reverser 31 is made capable of swaying between the loading/unloading section 2 and the polishing section 3 and is also made that its hand section for gripping the substrate is capable of rotating about its axis. The top ring 301A is made rotatable at a predetermined rotating speed by a means such as an electric motor. The polishing devices 30B, 30C, and 30D are the same in constitution as the polishing device 30A except they do not have the reverser 31 (corresponding parts are provided with the same reference numerals and symbols).

The polishing section 3 is the dirtiest (most soiled) area, as will be understood in consideration of using slurry for polishing. Therefore, in this embodiment, air is evacuated from around the polishing tables 300A-300D so that particles inside the polishing section 3 do not fly out of the polishing section 3. Particles are prevented from flying out by maintaining negative pressure inside the polishing section 3 relative to the exterior of the housing 1, and the cleaning section 4 and the loading/unloading section 2 located outside the polishing section 3. Also it is a common practice to provide an exhaust duct (not shown) below the polishing tables 300A-300D and high performance filters (not shown) such as HEPA filters above them, to form a down-flow of clean air cleaned through the exhaust ducts and the filters and flowing into the polishing section 3.

The cleaning section 4 includes: a transfer robot 40, a reverser 41 for reversing the substrate coming from the transfer robot 40, an ultrasonic cleaner 42 as an ultrasonic cleaning device for cleaning the substrate after it is polished, a roll cleaner 43 as a scrub cleaning device, a two-fluid jet cleaner 44 as a two-fluid jet cleaning device, a cleaner/dryer 45 for drying the substrate after cleaning, and a transfer unit 46 for transferring the substrate between the reverser 41 and the cleaners 42-45. The transfer robot 40, the reverser 41, and the cleaners 42-45 are disposed in series in the longitudinal direction of the housing 1. A fan filter unit (not shown) having an HEPA filter (High Efficiency Particulate Air filter) or the like is provided above each of the cleaners 42-45, and a down-flow of clean air, from which particles of a predetermined grain diameter is removed, is formed in the cleaning section 4. Also the interior of the cleaning section 4 is constantly maintained at a pressure higher than that in the polishing section 3 so as to prevent inflow of particles from the polishing section 3.

Figure 2A:
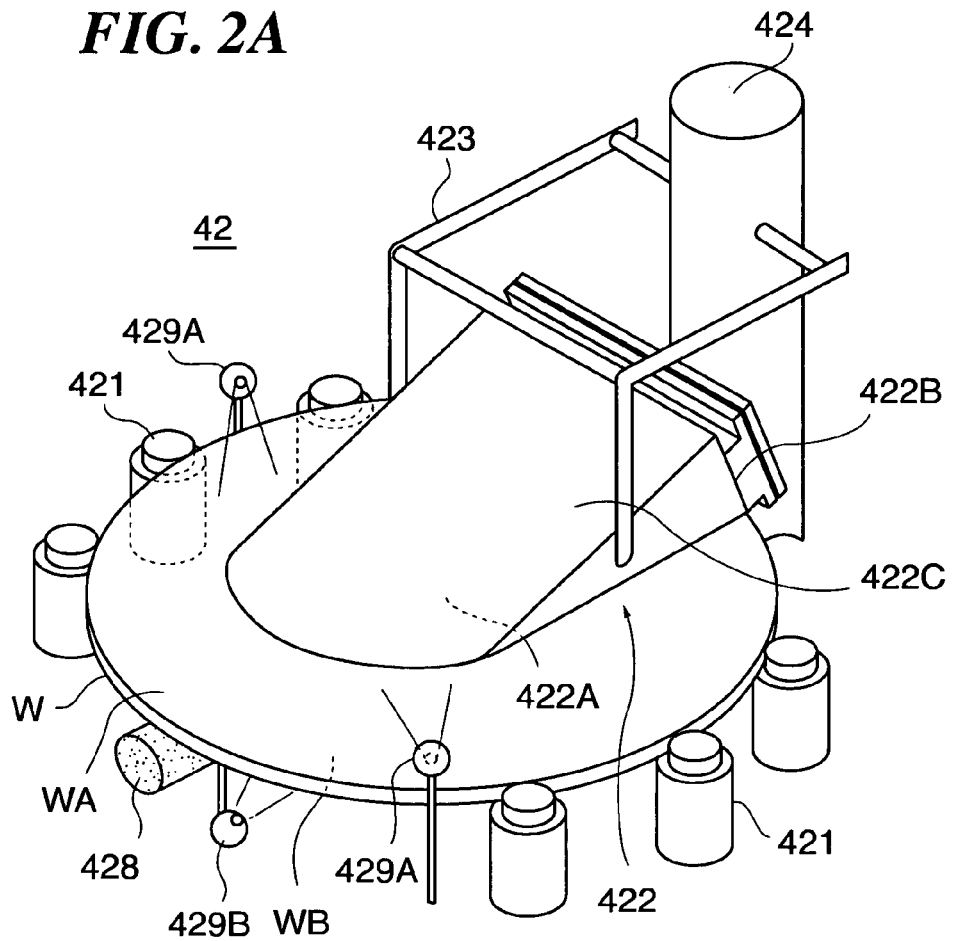
FIG. 2A is a perspective view of an ultrasonic cleaner.
Figure 2B:
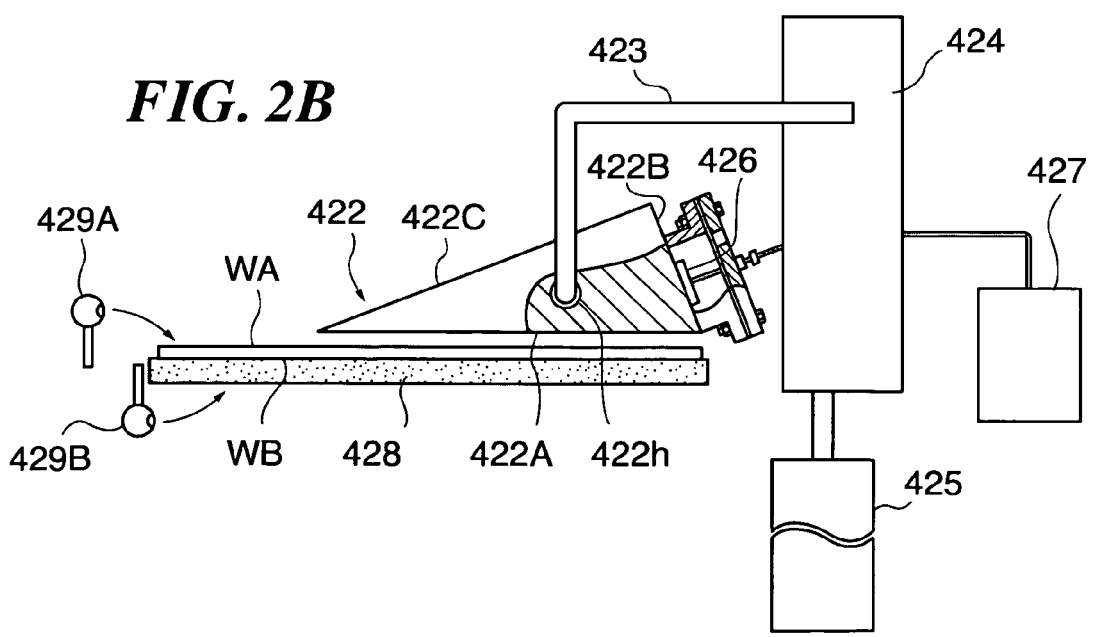
FIG. 2B is a side view of an ultrasonic cleaner.
Figure 3A:
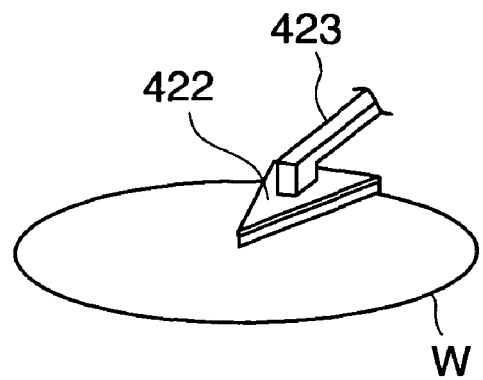
FIG. 3A is a perspective view of a first modified example of an ultrasonic emitter.
Figure 3B:
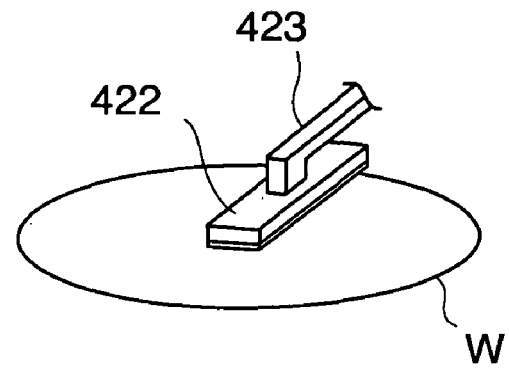
FIG. 3B is a perspective view of a second modified example of an ultrasonic emitter.
Figure 3C:
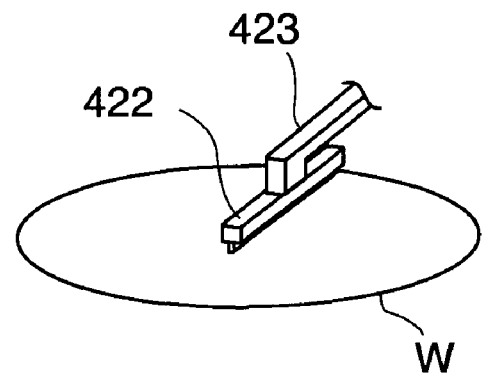
FIG. 3C is a perspective view of a third modified example, of an ultrasonic emitter.
Figure 3D:
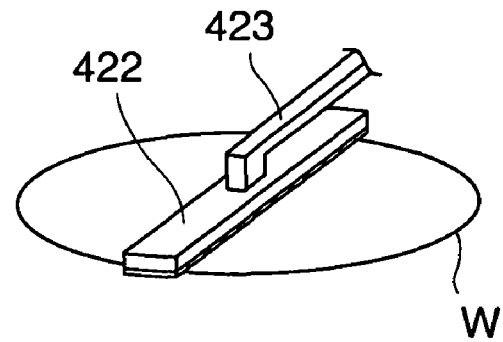
FIG. 3D is a perspective view of a fourth modified example of an ultrasonic emitter.

Here, in reference to FIG. 2, the constitution of the ultrasonic cleaner 42 is described in detail. FIG. 2A is a perspective view of the ultrasonic cleaner 42 and FIG. 2B is a side view of the ultrasonic cleaner 42. The ultrasonic cleaner 42 includes: rotary support members 421 for supporting and rotating a substrate W, an ultrasonic emitter 422 for transmitting ultrasonic waves through liquid to the top surface WA of the substrate W, a roll sponge 428 for scrubbing the under surface WB of the substrate W, and liquid supply nozzles 429A and 429B for supplying chemical liquid, pure water, etc. to the substrate W.

Each of the rotary support members 421 is made as a generally cylindrical roller extending in vertical direction. To maintain the substrate W generally horizontally, the number of the rotary support members 421 is three or more, typically four, or six as in this embodiment. The rotary support members 421 are respectively connected to driving sources (not shown) and may be rotated individually. By rotating the rotary support members 421 holding the substrate W, the substrate W may be rotated in a horizontal plane at rotating speeds of about 5 to 500 rpm. The plurality of rotary support members 421 for supporting the substrate W constitute an ultrasonic cleaning rotating mechanism. The driving sources (not shown) for rotating the rotary support members 421 are connected through signal cables to the control device 9 (See FIG. 1) so that their rotating speeds may be regulated.

The ultrasonic emitter 422 is formed in generally triangular column shape with: an emitting surface 422A as a first surface of generally rectangular shape opposing the top surface WA of the substrate W held with the rotary support members 421, a vibrating surface 422B as a second surface with its one side in contact with the emitting surface 422A to form an acute angle and provided with a vibrating element 426 for generating ultrasonic waves, and a top surface 422C as a third surface with its one side in contact with the vibrating surface 422B to form a generally right angle and also in contact with the emitting surface 422A to form an acute angle. In this embodiment, the side along which the emitting surface 422A and the top surface 422C contact each other is formed in arcuate shape. Therefore, the emitting surface 422A and the top surface 422C are not exactly rectangular but generally rectangular; the ultrasonic emitter 422 is not exactly of a triangular column shape but generally of a triangular column shape. Forming the ultrasonic emitter 422 in the generally triangular column shape makes it possible to give out ultrasonic vibration substantially free from mutual reinforcement or neutralization between vibrating waves emitted from the vibrating element 426 in the ultrasonic emitter 422 and reflected waves.

The emitting surface 422A of the ultrasonic emitter 422 is formed long enough for covering the radius of the substrate W. Because the emitting surface 422A is formed long enough for covering the radius of the substrate W, it is possible to clean the entire surface of the substrate W by simply rotating the substrate W without moving the ultrasonic emitter 422. Besides, because the emitting surface 422A is formed having an extended area, it is possible to lower energy per unit area and it becomes easy to retain chemical liquid between the top surface WA of the substrate W and the emitting surface 422A, which makes it possible to achieve both objects of reducing damage to the substrate W and improving cleaning performance. Both end faces of the triangular column shape of the ultrasonic emitter 422 are in generally triangular shape. A hollow 422h of a cylindrical shape is formed to penetrate the approximate center of gravity of the triangles of both the end faces. The hollow 422h diffuses reflected waves on this interface and produces uniform vibration energy from the emitting surface 422A. Part of a bracket 423 is made to pass through the hollow 422h. As described above, the bracket 423 is attached generally in the center of gravity of the generally triangular shapes of both end faces of the generally triangular column shape of the ultrasonic emitter 422.

The bracket 423, supporting the ultrasonic emitter 422 at its both ends, with its both ends extending generally vertically upward then bending toward the vibrating surface 422B to extend generally horizontally, is attached to an attachment shaft 424. An air cylinder 425, vertically movable, is disposed below the attachment shaft 424. As the air cylinder 425 moves, the ultrasonic emitter 422 may be vertically moved through both the attachment shaft 424 and the bracket 423. Thus, the ultrasonic emitter 422 may be moved toward and away from the substrate W. The vibrating element 426 attached to the vibrating surface 422B is typically a piezoelectric vibration element and electrically connected to an oscillator 427. For the oscillator 427, a self-excited oscillation type is employed, and is constituted that its output may be adjusted in the range of 5 to 100 percent. The vibrating element 426 is constituted to transmit ultrasonic energy, preferably megasonic energy of about 0.5 MHz to 5.0 MHz, to the ultrasonic emitter 422. It is preferable to provide cooling gas nozzles (not shown) in the vicinity of the vibrating element 426 to cool it by supplying air, nitrogen gas or the like to the surface of the vibrating element 426.

Incidentally as shown in FIG. 3, the ultrasonic emitter may be formed in shapes other than triangular column shape. When the emitting surface is formed in a triangular plate shape as shown in FIG. 3A, it is possible to reduce time and effort for manufacturing the ultrasonic emitter and also to cast ultrasonic waves to the peripheral part of the substrate W, where speed is high when the substrate W rotates, to the same extent as in the central part. When it is formed in a rectangular plate shape as shown in FIG. 3B, it is possible to reduce time and effort for manufacturing the ultrasonic emitter. When it is formed in a rod shape as shown in FIG. 3C, it is possible to reduce voltage to be applied to the vibrating element and also to reduce the cost for manufacturing the ultrasonic emitter. When it is formed in a rectangular plate shape of a size covering the diameter of the substrate as shown in FIG. 3D, it is possible to reduce the rotating speed of the substrate because ultrasonic waves are cast twice to intended part of the substrate while the substrate makes one turn.

In reference to FIG. 2 again, description of the constitution of the ultrasonic cleaner 42 will be continued. The roll sponge 428 is of a cylindrical column shape of a length greater than the diameter of the substrate W. The roll sponge 428 is disposed under the substrate W where its longitudinal direction is in parallel with the under surface WB of the substrate W when the substrate W is supported with the rotary support members 421. The roll sponge 428 is constituted to be rotatable about the axis of its cylindrical column shape. Also the roll sponge 428 is supported with a sponge support member (not shown) that is vertically movable. It is constituted that, as the sponge support member (not shown) moves up and down, the roll sponge 428 moves toward and away from the substrate W between positions in contact and not in contact with the under surface WB of the substrate W. The sponge support member (not shown) is provided with a pressure sensor or displacement sensor to detect the pressure or displacement of the sponge support member (not shown) and adjust the pressing force of the roll sponge 428 against the substrate W.

The liquid supply nozzles 429A and 429B are in a shape of a tube with perforation along its longitudinal direction or of a spray to conically spray. The liquid supply nozzle 429A is disposed above the substrate W supported with the rotary support members 421, and the liquid supply nozzle 429B is disposed below the substrate W, so that both the nozzles can supply pure water, chemical liquid, etc. to the top surface WA and the under surface WB of the substrate W, respectively. In particular when the top surface WA of the substrate W is hydrophobic, it is preferable to use the conical spray because the top surface WA and the under surface WB of the substrate W may be entirely covered with pure water, chemical liquid, etc. even when the rotating speed of the substrate W is low. The number of liquid supply nozzles 429A and 429B may be appropriately determined. Increasing the number makes it possible to increase the number of types of chemical liquid, etc. that may be supplied to the substrate W.

Figure 4:
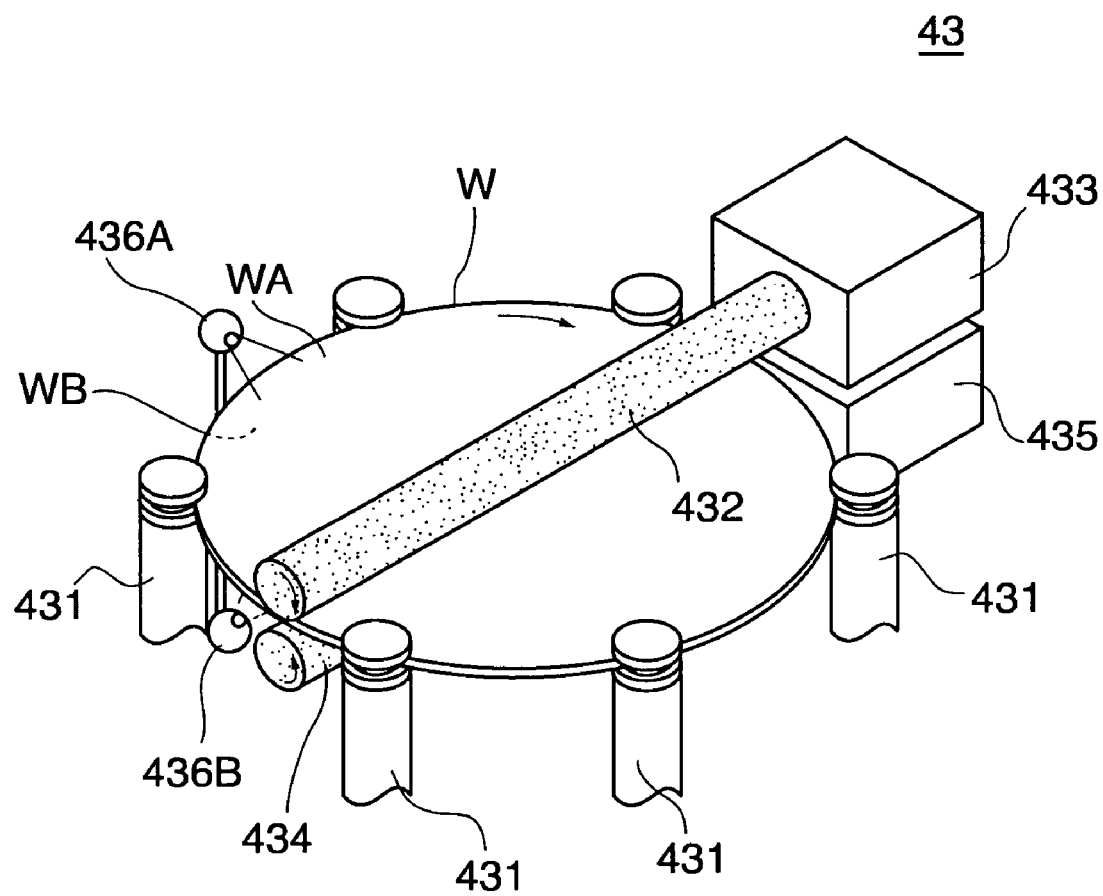
FIG. 4 is a perspective view of a roll cleaner.

Next, in reference to FIG. 4, the constitution of the roll cleaner 43 will be described. FIG. 4 is a perspective view of the roll cleaner 43. The roll cleaner 43 includes: rotary support members 431 for holding and rotating the substrate W, a roll sponge 432 as a scrubbing piece for scrubbing the top surface WA of the substrate W, a roll sponge 434 for scrubbing the under surface WB, and liquid supply nozzles 436A and 436B for supplying chemical liquid, pure water, etc. to the substrate W.

The rotary support member 431 is similar in constitution to the rotary support member 421 (See FIG. 2) of the ultrasonic cleaner 42, so as to hold the periphery of the substrate W and rotate it in a horizontal plane at rotating speeds of about 5 to 500 rpm. The rotating speed of the substrate W is controlled with the control device (See FIG. 1) connected through signal cables. The roll sponges 432 and 434 are sponges of a cylindrical column shape of a length greater than the diameter of the substrate W, with the roll sponge 432 disposed over the substrate W supported with the rotary support members 431 and with the roll sponge 434 disposed under the substrate W. They are disposed with their longitudinal directions in parallel with the surface of the substrate W respectively. While the roll sponges 432 and 434 may typically be made of porous PVA sponge, they also may be made of urethane foam. The smaller the average diameter of pores formed in the sponge is, the higher the ability of removing particles is. The roll sponges 432 and 434 are adapted to be rotatable about their respective axes of the cylindrical column shape. The roll sponges 432 and 434 are also respectively supported with sponge support members 433 and 435 that are vertically movable. It is adapted that the roll sponges 432 and 434 move toward or away from the substrate W between positions in contact and not in contact with the substrate W as the sponge support members 433 and 435 move vertically. The sponge support members 433 and 435 are respectively provided with a pressure sensor or displacement sensor to detect the pressures or displacements of the sponge support members 433 and 435 and adapted to adjust pressing forces of the roll sponges 432 and 434 against the substrate W. Incidentally, the sponge as a scrubbing piece may be in other shape than the roll shape, such as hemisphere or pencil shape. When the sponge is in the shape of hemisphere or pencil, the sponge is attached to a swing arm and adapted to reciprocate between the center and periphery of the substrate W.

The liquid supply nozzles 436A and 436B are in a shape of a tube with perforation along its longitudinal direction or of a spray to conically spray, with the spray nozzle 436A disposed above the substrate W supported with the rotary support members 431 and the spray nozzle 436B disposed below the substrate W, to be capable of supplying pure water, chemical fluid, etc. to the top surface WA and under surface WB of the substrate W. In particular when the top surface WA of the substrate W is hydrophobic, it is preferable to use the conical spray because the top surface WA and the under surface WB of the substrate W may be entirely covered with pure water, chemical liquid, etc. even when the rotating speed of the substrate W is low. The number of liquid supply nozzles 436A and 436B may be appropriately adjusted. Increasing the number makes it possible to increase the number of types of chemical liquid, etc. that can be supplied to the substrate W.

Figure 5A:
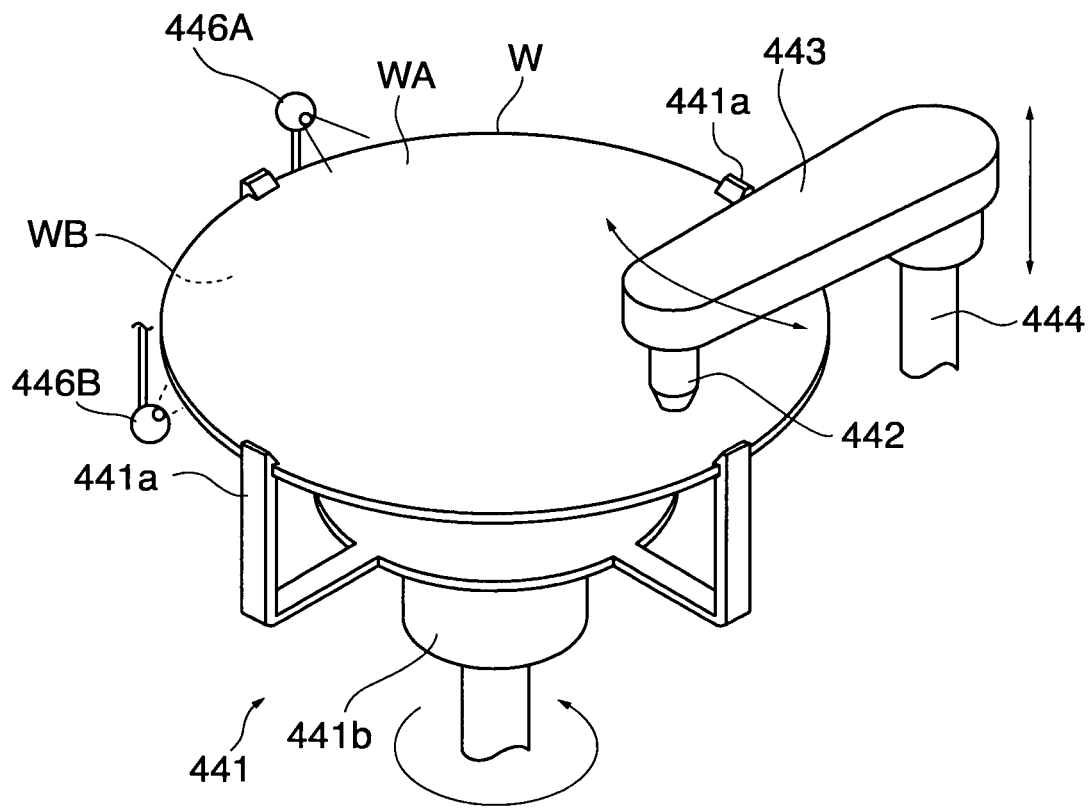
FIG. 5A is a perspective view of a two-fluid jet cleaner.
Figure 5B:
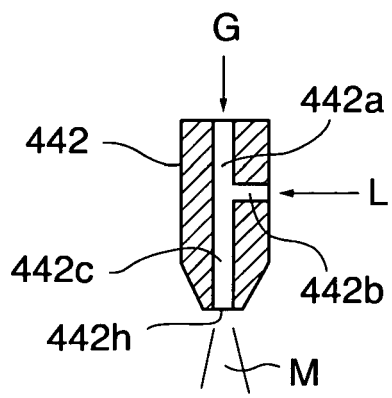
FIG. 5B is a detailed sectional view of a two-fluid nozzle.

Next, in reference to FIG. 5, the constitution of the two-fluid jet cleaner 44 will be described. FIG. 5A is a perspective view of the two-fluid jet cleaner 44, and FIG. 5B shows a detailed sectional view of a two-fluid nozzle. The two-fluid jet cleaner 44 includes: a rotary chuck 441 for holding and rotating the substrate W, a two-fluid nozzle 442 for drawing in gas and liquid and spraying mist M, and liquid supply nozzles 446A and 446B for supplying chemical liquid, pure water, etc. to the substrate W.

The rotary chuck 441 includes: a plurality of chuck claws 441a for chucking the substrate W, and a chuck base 441b connected to an electric motor (not shown); and is adapted to rotate the substrate W in a horizontal plane at rotating speeds of about 50 to 3000 rpm. The rotary chuck 441 serves as a two-fluid jet cleaning rotating mechanism. The electric motor (not shown) for rotating the chuck base 441b is connected through a signal cable to the control device 9 (See FIG. 1) so that the rotating speed of the substrate W may be regulated.

In the two-fluid nozzle 442 are formed a gas inflow passage 442a for drawing in gas G and a liquid inflow passage 442b for drawing in liquid L, and both the passages 442a and 442b are joined together inside the nozzle 442 to form a mist spray passage 442c. The angle and position at which the gas inflow passage 442a and the liquid inflow passage 442b are joined are not limited to the examples shown in the drawing; both the passages 442a and 442b may be joined at different angles other than right angles, or the liquid inflow passage 442b may be located within the gas inflow passage 442a, like forming a double tube. As the gas G, nitrogen or other inert gasses may be used. As the liquid L, substance such as aqueous solution of carbon dioxide that prevents electrostatic charge on the substrate W is typically used; however, other chemical liquid for use in cleaning the substrate W, such as aqueous solution of ammonia or various liquid preparations for use in cleaning process, may also be used. The two-fluid nozzle 442 is adapted to flow simultaneously a predetermined flow rate of gas G through the gas inflow passage 442a and a predetermined flow rate of liquid L through the liquid inflow passage 442b, so that mist M flowing through the mist spray passage 442c is sprayed out of a mist spray outlet 442h at high speeds. The two-fluid nozzle 442 is attached to a swing arm 443 capable of swinging parallel to the top surface WA of the substrate W, so that the mist spray outlet 442h faces the substrate W. The swing arm 443 is attached to a vertical motion shaft 444 movable at right angles to the top surface WA of the substrate W.

The liquid supply nozzles 446A and 446B are in a shape of a tube with perforation along its longitudinal direction or of a spray to conically spray. The liquid supply nozzle 446A is disposed above the substrate W supported with the rotary chuck 441, and the liquid supply nozzle 446B is disposed below the substrate W, so that both the nozzles can supply pure water, chemical liquid, etc. to the top surface WA and under surface WB of the substrate W, respectively. In particular when the top surface WA of the substrate W is hydrophobic, it is preferable to use conical spray because the top surface WA and the under surface WB of the substrate W may be entirely covered with pure water, chemical liquid, etc. even when the rotating speed of the substrate W is low. The number of liquid supply nozzles 446A and 446B may be appropriately adjusted. Increasing the number makes it possible to increase the number of types of chemical liquid, etc. that can be supplied to the substrate W.

Figure 6:
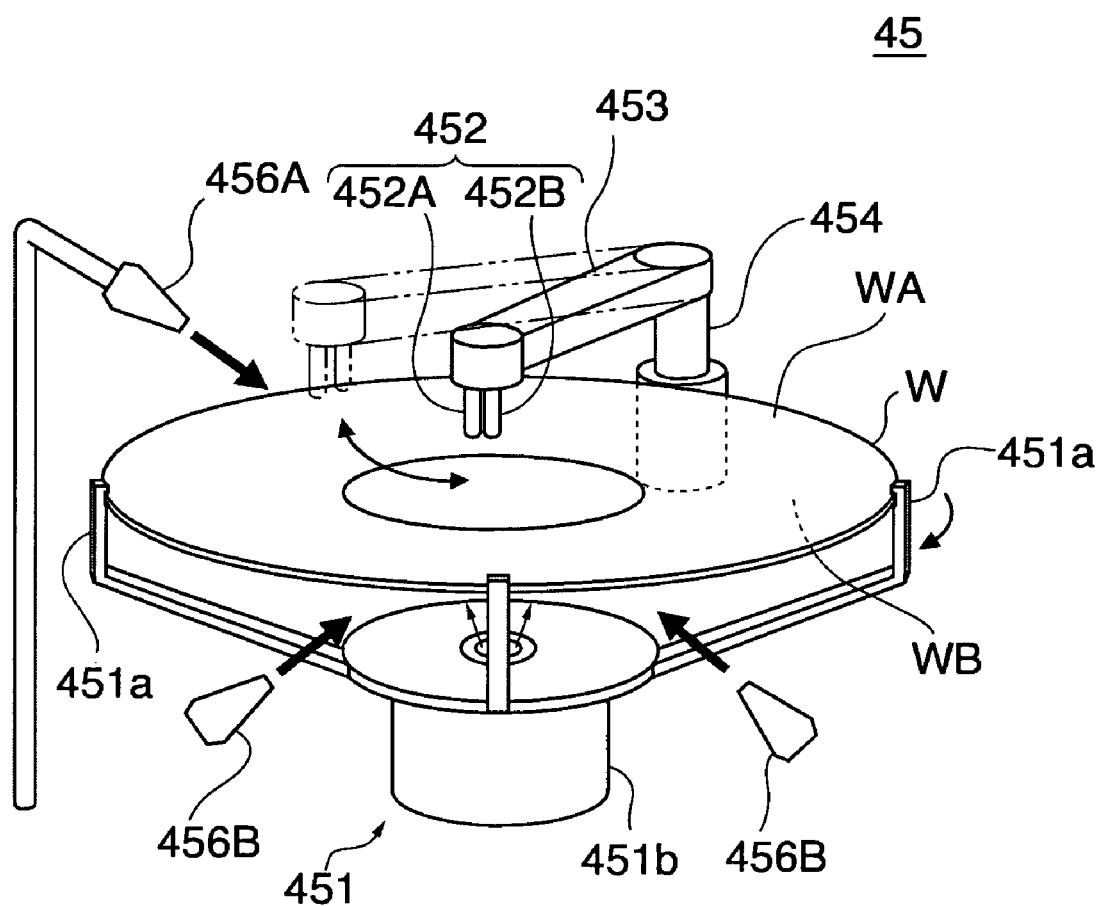
FIG. 6 is a perspective view of a cleaner/dryer.

Next, in reference to FIG. 6, the constitution of the cleaner/dryer 45 will be described. FIG. 6 is a perspective view of the cleaner/dryer 45. The cleaner/dryer 45 includes: a rotary chuck 451 for holding and rotating the substrate W, a drying nozzle 452 having a water supply nozzle 452A and a gas supply nozzle 452B, and liquid supply nozzles 456A and 456B for supplying rinsing water to the substrate W.

The rotary chuck 451 has: a plurality of chuck claws 451a for chucking the substrate W, and a chuck base 451b connected to an electric motor (not shown); and is adapted to rotate the substrate W in a horizontal plane at rotating speeds of about 50 to 3000 rpm. The electric motor (not shown) for rotating the chuck base 451b is connected through a signal cable to the control device 9 (See FIG. 1) so that the rotating speed of the substrate W may be regulated.

The water supply nozzle 452A supplies water to the substrate W to prevent watermarks (water stain) from being produced by the evaporation of water unevenly wetting the substrate W to be dried. The water to be supplied is typically pure water; however, deionized water, aqueous solution of carbon dioxide may also be used depending on the purpose. The gas supply nozzle 452B supplies gas, for removing water supplied from the water supply nozzle 452A to the substrate W, to the substrate W. The gas to be supplied is typically IPA (isopropanol) vapor. The drying nozzle 452 is attached to a swing arm 453 extending generally parallel to the top surface WA of the substrate W.

The swing arm 453 is connected to a swing shaft 454 attached to a drive source (not shown). The swing shaft 454 is adapted to be rotatable about its axis. The drying nozzle 452 is adapted to swing between center and periphery of the substrate W by the rotation of the swing shaft 454. The drying nozzle 452 is adapted, when it swings, so that the water supply nozzle 452A is on the periphery side of the substrate W and the gas supply nozzle 452B is on the center side. While the rotary chuck 451 rotates the substrate W and the drying nozzle 452 is moved from center to periphery of the substrate W, water is supplied from the water supply nozzle 452A and IPA vapor is supplied from the gas supply nozzle 452B so that the substrate W is dried.

The liquid supply nozzles 456A and 456B are in a shape of a tube with perforation along its longitudinal direction or of a spray to conically spray. The liquid supply nozzle 456A is disposed above the substrate W chucked with the rotary chuck 451, and the liquid supply nozzles 456B are disposed below the substrate W. They are adapted to be capable of supplying rinsing water respectively to the top surface WA and the under surface WB of the substrate W.

Incidentally, with the cleaner/dryer 45, it is also possible, without using the drying nozzle 452, to spin-dry the substrate W by rotating the substrate W with the rotary chuck 451 at high speeds.

The control device 9 shown in FIG. 1 controls operation of various components of the substrate processing apparatus 100, and the start, stop, and choice of water and gas supplied to the substrate W. As a matter of course, it also controls operation in various parts of the loading/unloading section 2, the polishing section 3, and the cleaning section 4, and the transfer of substrates between them. The control device 9 also controls the ultrasonic cleaning rotating mechanism and two-fluid jet cleaning rotating mechanism. The control device 9 performs the above controls according to preinstalled programs.

Continuously in reference to FIGS. 1 to 6, functions or operations of the substrate processing apparatus 100 will be described. The following functions are controlled mainly with the control device 9. A substrate stored in the wafer cassette 20 is taken out with the transfer robot 22 and delivered to the reverser 31. After reversing the substrate with the reverser 31, the substrate is delivered to the lifter 32A. After moving the top ring 301A above the lifter 32A, the wafer is lifted with the lifter 32A to bring it into contact with the top ring 301A. When the substrate comes into contact with the top ring 301A, the interior of the top ring 301A is evacuated to a negative pressure to suction the wafer to the top ring 301A. After moving the attracted substrate above the polishing table 300A, the substrate is brought into contact with the polishing table 300A, and the interior of the top ring 301A is raised to a predetermined positive pressure. When the predetermined pressure is reached, supply of polishing liquid from the polishing liquid supply nozzle 302A to the polishing table 300A is started. At the same time, the surface of the substrate is polished by rotating the polishing table 300A and the top ring 301A at predetermined rotating speeds.

Polishing the surface of the substrate is carried out by a predetermined amount according to conditions of wiring formed on the substrate. The predetermined amount to be polished is adjusted for example by the polishing time according to the rotating speeds of the polishing table 300A and the top ring 301A, the condition of the polishing table 300A, etc. Alternatively, the amount of polishing may be adjusted by means of other types of control: for example, a control in which polished amount is adjusted while detecting the state of removed metallic film with an eddy current type monitor capable of detecting the residual film thickness formed on the surface of the substrate, or with an optical type monitor capable of detecting transmission film thickness, a control in which the polishing state is grasped by a table current indicating the rotating torque of the polishing table 300A, etc. When the surface of the substrate is polished by a predetermined amount, supply of polishing liquid from the polishing liquid supply nozzle 302A is stopped, and the substrate is polished while supplying pure water from a pure water supply nozzle (not shown) When the substrate is polished for a predetermined period of time while supplying pure water, the interior of the top ring 301A is put to a negative pressure to suction the substrate to the top ring 301A. Then, the substrate is raised and removed from the polishing table 300A by raising the top ring 301A, moved above the lifter 32A, and placed on the lifter 32A. At this time, the polishing cloth attached to the polishing table 300A is conditioned by polishing it with the dresser 303A. When the substrate is placed on the lifter 32A, the lifter 32A is moved horizontally to a position TP4, the substrate is raised by the pusher 33B to the height of the hand of the transfer robot 40 of the cleaning section 4, and then the transfer robot 40 receives the substrate.

Alternatively, the substrate may be polished with the polishing device 30B, or in two stages in which the substrate is polished first with the polishing device 30A, followed by the polishing device 30B. When polishing is carried out in two stages, the surface of the substrate may be polished finely with polishing cloth or whetstone of different roughness while shortening the polishing time. It is also possible to increase the number of substrates processed per unit time by processing in parallel two substrates with the polishing device 30A and/or polishing device 30B, and the polishing device 30C and/or polishing device 30D.

When the transfer robot 40 delivers the substrate to the reverser 41, the reverser 41 reverses the substrate and delivers it through the transfer unit 46 to the ultrasonic cleaner 42.

In reference to FIG. 2, functions or operations of the ultrasonic cleaner 42 will be described. The substrate W sent with the transfer unit 46 (See FIG. 1) is held with the side faces of the plurality (six in this embodiment) of rotary support members 421, and rotated at speeds of about 5 to 80 rpm. Chemical liquid is supplied from the liquid supply nozzle 429A to the top surface WA of the substrate W. After that, the ultrasonic emitter 422 is moved above the substrate W so that the distance between the emitting surface 422A and the top surface WA of the substrate W is about 0.5 to 4.0 mm and that the emitting surface 422A covers the radius of the substrate W.

When the ultrasonic emitter 422 is set in the above-described position, a predetermined output of ultrasonic waves (megasonic energy) is emitted from the vibrating element 426 and transmitted from the emitting surface 422A through chemical fluid to the top surface WA of the substrate W to clean the top surface WA of the substrate W with the ultrasonic waves. This ultrasonic cleaning is solid matter noncontact cleaning. At this time, because the rotating speed of the substrate W is made to about 5 to 80 rpm, it is possible to retain liquid film between the ultrasonic emitter 422 and the top surface WA of the substrate W. Besides, in the case the ultrasonic emitter 422 is generally in triangular column shape, ultrasonic vibration is given to the substrate W substantially free from mutual reinforcement or neutralization between vibration waves emitted from the vibrating element 426 and reflected waves. Besides, in the ultrasonic cleaning, it is possible to start cleaning immediately after setting the ultrasonic emitter 422, so that initializing time is unnecessary. When the top surface WA of the substrate W is cleaned with ultrasonic waves of predetermined output as described above, it is possible to remove dust present in the recesses, formed in the top surface WA of the substrate W as necessary for positioning when manufacturing semiconductor devices, of a predetermined width of 2.0 micrometers or smaller and a predetermined value or greater (about 0.5 micrometers or greater) determined by the type of the semiconductor device manufacturing apparatus, or to remove dust present in the recesses, formed in the process of polishing the top surface WA of the substrate W, of a width of about 10 to 50 nm and depth of 10 to 100 nm. In particular when the top surface WA of the substrate W is cleaned with the ultrasonic cleaner 422 having the emitting surface 422A, it is possible to retain chemical liquid film between the emitting surface 422A and the substrate W's surface, so as to effectively remove dust present in the above-mentioned recesses.

While the ultrasonic cleaning is being carried out as described above, the under surface WB of the substrate W is cleaned by supplying chemical liquid from the liquid supply nozzle 429B to the under surface WB of the substrate W and at the same time pressing the roll sponge 428 against the under surface WB of the substrate W with a predetermined pressing force and rotating the roll sponge 428. When the ultrasonic cleaning of the top surface WA of the substrate W and cleaning of the under surface WB with the roll sponge 428 are carried out for a predetermined period of time, the ultrasonic emitter 422 and the roll sponge 428 are removed from the substrate W, the rotating speed of the substrate W is increased to about 100 to 150 rpm, to carry out rinse by supplying pure water, etc. from the liquid supply nozzles 429A and 429B to both the surfaces of the substrate W. When the rinse is over, the substrate W is delivered through the transfer unit 46 (See FIG. 1) to the roll cleaner 43 (See FIG. 1). Incidentally, cleaning the under surface WB of the substrate W with the roll sponge 428 may be carried out after cleaning the top surface WA of the substrate W with the ultrasonic emitter 422.

Next, in reference to FIG. 4, functions or operations of the roll cleaner 43 will be described. The substrate W sent with the transfer unit 46 (See FIG. 1) is held with the side faces of the plurality (six in this embodiment) of rotary support members 431, and rotated at speeds of about 100 to 150 rpm. Chemical liquid is supplied from the liquid supply nozzles 436A and 436B to both the surfaces of the substrate W. At the same time, the roll sponges 432 and 434 are pressed against both the surfaces of the substrate W with a predetermined pressure. The roll sponges 432 and 434 are rotated to clean both the surfaces of the substrate W. With the roll cleaner 43, because the substrate W is cleaned by scrubbing it with the roll sponges 432 and 434, it is possible to remove particles that are hard to remove. Here, while the substrate W is cleaned by using the roll sponges 432 and 434, because particles are already removed roughly with the ultrasonic cleaner 42 (See FIGS. 1 and 2), contamination of the roll sponges 432 and 434 of the roll cleaner 43 remains small in degree. When both the surfaces of the substrate W are cleaned for a predetermined period of time, the roll sponges 432 and 434 are retracted from the substrate W and both the surfaces of the substrate W are rinsed by supplying pure water, etc. from the liquid supply nozzles 436A and 436B while maintaining the rotating speed of the substrate W at about 100 to 150 rpm. When the rinse is over, the substrate W is delivered through the transfer unit 46 (See FIG. 1) to the two-fluid jet cleaner 44 (See FIG. 1).

Next, in reference to FIG. 5, functions or operations of the two-fluid jet cleaner 44 will be described. The substrate W sent with the transfer unit 46 (See FIG. 1) is held with the chuck claws 441a of the rotary chuck 441 and rotated at rotating speeds of about 450 to 550 rpm. First, chemical liquid is supplied from the liquid supply nozzles 446A and 446B to both the surfaces of the substrate W to clean them. Next, the two-fluid nozzle 442 is moved above the center of the substrate W. Here, the two-fluid nozzle 442 is disposed so that its tip (the mist spray outlet 442h) is at a distance of about 2 to 10 mm off the top surface WA of the substrate W.

When the two-fluid nozzle 442 is disposed in the predetermined position above the substrate W, gas G is introduced into the gas inflow passage 442a, and liquid L is introduced into the liquid inflow passage 442b. In this embodiment, mist M capable of removing particles off the top surface WA of the substrate W may be sprayed out of the mist spray outlet 442h by flowing gas G at about 30 to 200 lit/min and liquid L at about 0.05 to 0.3 lit/min at the same time, respectively. Upon starting the spray of mist M, the two-fluid nozzle 442 moves at a predetermined speed from the center to the periphery of the substrate W and back to the center again. The two-fluid jet cleaner 44 carries out cleaning by blowing off particles by the spraying force of the mist M. The predetermined moving speed of the two-fluid nozzle 442 may be determined according to the rotating speed of the substrate W. By the motion of the two-fluid nozzle 442, particles are removed from the entire top surface WA of the substrate W. Here, because the rotating speed of the substrate W is set to about 450 to 550 rpm, cleaning time of the substrate W with the two-fluid nozzle 442 may be shortened. In the two-fluid jet cleaning, the cleaning may be started immediately after setting the two-fluid nozzle 442, so that initializing time is unnecessary. When the top surface WA of the substrate W is cleaned with the high speed mist M as described above, it is possible to remove dust present in the recesses, formed in the top surface WA of the substrate W as necessary for positioning when manufacturing semiconductor devices, of a predetermined width of 2.0 micrometers or smaller and a predetermined value or greater (about 0.5 micrometers or greater) determined by the type of the semiconductor device manufacturing apparatus, or to remove dust present in the recesses, formed in the process of polishing the top surface WA of the substrate W, of a width of about 10 to 50 nm and depth of 10 to 100 nm.

When the cleaning with the mist M by one cycle of back-and-forth motion of the two-fluid nozzle 442 between the center and periphery of the substrate W is over, the two-fluid nozzle 442 is removed from the vicinity of the substrate W while maintaining the rotating speed of the substrate W. Pure water, etc. is supplied from the liquid supply nozzles 446A and 446B to both the surfaces of the substrate W to rinse them. As described above, because the two-fluid jet cleaning, or solid matter noncontact cleaning, is carried out after cleaning with the roll sponge 432 (See FIG. 4), the substrate W is thoroughly cleaned with the two-fluid jet down to the recesses after it has been cleaned with high cleaning effect, so that cleaning time may be shortened while maintaining high cleaning performance. When the rinse is over, the substrate W is returned through the transfer unit 46 (See FIG. 1) to the cleaner/dryer 45 (See FIG. 1).

Next, in reference to FIG. 6, functions or operations of the cleaner/dryer 45 will be described. The substrate W sent through the transfer unit 46 (See FIG. 1) is held with the rotary chuck 451 and rotated at rotating speeds of about 200 to 300 rpm. First, both the surfaces of the substrate W are covered with water by supplying pure water, etc. from the liquid supply nozzles 456A and 456B to both the surfaces of the substrate W. Next, the drying nozzle 452 is moved above the center of the substrate W, and the drying nozzle 452 is moved at a predetermined speed from the center to the periphery of the substrate W while supplying pure water, etc. from the water supply nozzle 452A and supplying IPA vapor from the gas supply nozzle 452B, respectively. At this time, the top surface WA of the substrate W is dried with the IPA vapor. When the drying nozzle 452 reaches the periphery of the substrate W, the drying nozzle 452 is removed from the vicinity of the substrate W. After that, the rotating speed of the substrate W is increased to about 500 to 1500 rpm to throw away water droplets remaining on both the surfaces of the substrate W by centrifugal force, so that both the surfaces of the substrate W are dried. Alternatively, the substrate W may be dried, without using the drying nozzle 452, by centrifugal forces from the beginning by setting the rotating speed of the substrate W at about 500 to 1500 rpm (spin-drying). When the substrate W is spin-dried, it is possible to do so with the rotary chuck 441 (See FIG. 5) of the two-fluid jet cleaner, while omitting the cleaner/dryer 45. Omitting the cleaner/dryer 45 downsizes the apparatus. On the other hand, in the case the two-fluid jet cleaner 44 is separately provided, the substrate W may be prevented from being contaminated with chemical liquid remaining in the chamber.

When drying the substrate W is over, the transfer robot 22 (See FIG. 1) of the loading/unloading section 2 receives the substrate W and stows it in the wafer cassette 20 for stowing the cleaned substrate W (See FIG. 1). In this embodiment as described above, the substrate W is polish-processed, followed by removal of particles adhering on the top surface WA and the recesses of the substrate W with the ultrasonic cleaner 42 (See FIG. 2). Next, particles are removed and metallic contamination is cleaned using chemical liquid with the roll cleaner 43 (See FIG. 4). Next, very small amount of particles remaining due to the previous step of scrub cleaning are removed from the top surface WA and the recesses of the substrate W with the two-fluid jet cleaner 44 (See FIG. 5). Finally, the substrate W is dried with the cleaner/dryer 45. Such a combination of steps makes it possible to clean the recesses in the substrate W and remove particles coming out of the roll sponge itself, which has been impossible by only scrub cleaning with the roll sponge, and makes it possible to efficiently polish and clean the substrate W on which recesses are formed.

In the above description, the steps in the cleaning section 4 are carried out in the order of: the ultrasonic cleaning with the ultrasonic cleaner 42, the scrub cleaning with the roll cleaner 43, the two-fluid jet cleaning (mist cleaning) with the two-fluid jet cleaner 44, and the drying with the cleaner/dryer 45. However, all the above cleaning steps need not be provided or the cleaning may be carried out in different order from the above depending on the type of the substrate or other conditions. For example, in the above embodiment, the substrate W may be dried by increasing its rotating speed to about 1500 rpm after pure-water rinsing with the two-fluid jet cleaner 44 having a rotary chuck capable of rotating the substrate at relatively high speeds, to omit the cleaner/dryer 45, and simplify the constitution of the apparatus.

Further for example, a second embodiment is possible in which the two-fluid jet cleaner 44 in the cleaning section 4 shown in FIG. 1 is replaced with the ultrasonic cleaner 42 (that is to say, the cleaning section 4 has two ultrasonic cleaners 42) and steps in the cleaning section 4 are carried out in the order of: ultrasonic cleaning of the top surface of the substrate, roll cleaning of the under surface and pure water rinse of both the surfaces with the ultrasonic cleaner 42; scrub cleaning and pure water rinse with the roll cleaner 43, again the ultrasonic cleaning of the top surface of the substrate, roll cleaning of the under surface, and pure water rinse of both the surfaces with the ultrasonic cleaner 42; and drying with the cleaner/dryer 45. In this second embodiment, it is easy to retain chemical fluid in the ultrasonic cleaner 42, to derive the effect of the chemical fluid, and to improve cleaning effect on the under surface of the substrate.

As another example, a third embodiment is possible in which the ultrasonic cleaner 42 in the cleaning section 4 shown in FIG. 1 is replaced with the two-fluid jet cleaner 44 (that is to say, the cleaning section 4 has two two-fluid jet cleaners 44) and steps in the cleaning section 4 are carried out in the order of: chemical liquid cleaning, two-fluid jet cleaning, and pure water rinse of the surface of the substrate with the two-fluid jet cleaner 44; scrub cleaning and pure water rinse with the roll cleaner 43; again the chemical liquid cleaning, two-fluid jet cleaning, and pure water rinse of the surface of the substrate with the two-fluid jet cleaner 44; and drying with the cleaner/dryer 45. This third embodiment makes it possible to control the energy of mist striking the substrate by changing the mist spouting speed. Therefore, when the type of the substrate is changed, damages to the substrate may be avoided by appropriately coping with the change. Also this third embodiment may be adapted to dry the substrate by rotating it at high speeds with the two-fluid jet cleaner 44 (spin-drying) and omit the provision of the cleaner/dryer 45.

As still another example, a fourth embodiment is possible in which the roll cleaner 43 is replaced with the ultrasonic cleaner 42, and the cleaner/dryer 45 is replaced with the two-fluid jet cleaner 44 in the cleaning section 4 shown in FIG. 1 (that is to say, the cleaning section 4 has two ultrasonic cleaners 42 and the two-fluid jet cleaners 44), to carry out cleaning in the order of steps as enumerated below. First, the top surface of the substrate is cleaned with ultrasonic waves and the under surface of the substrate is roll-cleaned with the first ultrasonic cleaner 42, followed by pure water rinse. The substrate is moved to the second ultrasonic cleaner 42 and processed like with the first ultrasonic cleaner 42. Next, the first two-fluid jet cleaner 44, without spraying mist, carries out only cleaning with chemical liquid spouted from the liquid supply nozzle, followed by pure water rinse. The substrate is moved to the second two-fluid jet cleaner 44 to carry out pure water rinse, followed by spin-drying. In the fourth embodiment, metallic contamination is cleaned with the first two-fluid jet cleaner 44 using chemical liquid and the substrate is spin-dried with the second two-fluid jet cleaner 44. Therefore, neither of them uses the two-fluid nozzle, and so the two-fluid nozzle need not be provided. While the apparatus may be downsized with a constitution in which the cleaning section 4 includes one ultrasonic cleaner 42 and one two-fluid jet cleaner 44, a constitution in which the cleaning section 4 includes two ultrasonic cleaners 42 and two two-fluid jet cleaners 44 makes it easy to use different chemical liquids in respective chambers (to use liquids that are likely to react with each other in separate chambers), and to facilitate the control of contamination levels in respective chambers.

As still another example, a fifth embodiment is possible in which the ultrasonic cleaner 42, the roll cleaner 43, and the cleaner/dryer 45 in the cleaning section 4 shown in FIG. 1 are replaced respectively with two-fluid jet cleaners 44 (that is to say, the cleaning section 4 has four two-fluid jet cleaners 44) to carry out cleaning in the order of steps as enumerated below. First, the surface of the substrate is cleaned with chemical liquid and two-fluid jet with the first two-fluid jet cleaner 44, followed by pure water rinse. The substrate is moved to the second two-fluid jet cleaner 44 and processed like with the first two-fluid jet cleaner 44. Next, the third two-fluid jet cleaner 44, without spouting mist, carries out only cleaning with chemical liquid from the liquid supply nozzle, followed by pure water rinse. The substrate is moved to the fourth two-fluid jet cleaner 44, pure water-rinsed, and spin-dried. In the fifth embodiment, the third two-fluid jet cleaner 44 cleans metallic contamination using cleaning liquid and the fourth two-fluid jet cleaner 44 spin-dries the substrate. As the third and fourth two-fluid jet cleaners 44 do not use the two-fluid nozzles, the two-fluid nozzles need not be provided. Incidentally, it is also possible to spin-dry the substrate with the third two-fluid jet cleaner 44 and omit the provision of the cleaner/dryer 45.

As still another example, a sixth embodiment is possible in which the roll cleaner 43 is replaced with the ultrasonic cleaner 42, and the cleaner/dryer 45 is replaced with the two-fluid jet cleaner 44 in the cleaning section 4 shown in FIG. 1 (that is to say, the cleaning section 4 has two ultrasonic cleaners 42 and two two-fluid jet cleaners 44) to carry out cleaning in the order of steps as enumerated below. In the first ultrasonic cleaner 42, the top surface of the substrate is cleaned with ultrasonic waves and the under surface is roll-cleaned, followed by pure water rinse. The substrate is moved to the second ultrasonic cleaner 42 and processed like with the first ultrasonic cleaner 42. Next, with the first two-fluid jet cleaner 44, the top surface of the substrate is cleaned with chemical liquid and with two-fluid jet, followed by pure water rinse. The substrate is moved to the second two-fluid jet cleaner 44, rinsed with pure water, and spin-dried. With the combination in the sixth embodiment, ultrasonic cleaning is carried out twice with the ultrasonic cleaner 42, and two-fluid jet cleaning is carried out with the two-fluid jet cleaner 44. Therefore, it is possible to clean the recesses that cannot be cleaned by only the scrub cleaning with the roll cleaner 43. Incidentally in the sixth embodiment, the first to third cleaning chambers of the cleaning section 4 may be any combination of the ultrasonic cleaner 42 and the two-fluid jet cleaner 44, and the fourth cleaning chamber may be adapted to dry the substrate. In the case the third is the two-fluid jet cleaner 44, it may be adapted to dry the substrate there, so that the cleaner/dryer 45 may be omitted.

In the above description, the ultrasonic cleaner 42, as an ultrasonic cleaning device, is assumed to have the ultrasonic emitter 422 formed in generally triangular column shape; however, the cleaning section 4 may be constituted by replacing the ultrasonic cleaner 42 with an ultrasonic cleaner 52 (See FIG. 7) described below.

Figure 7A:
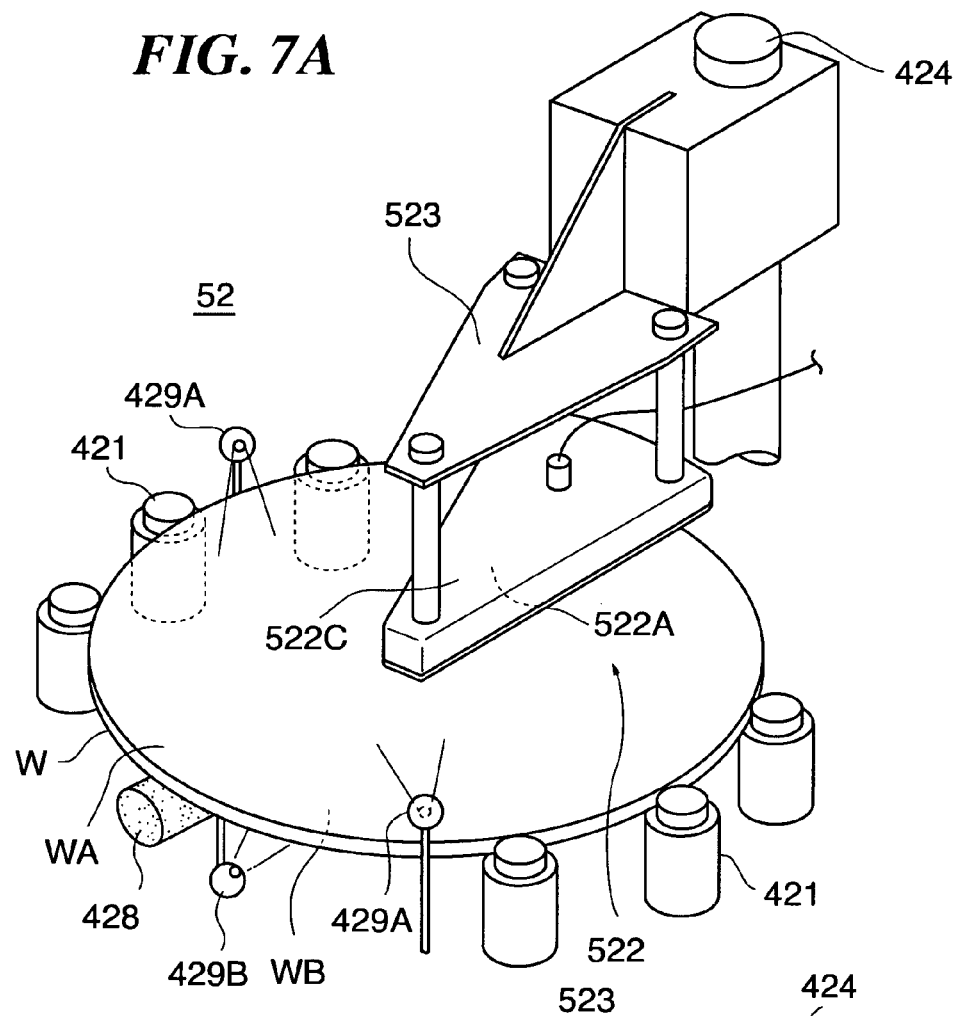
FIG. 7A is a perspective view of a modified example of the ultrasonic cleaner.
Figure 7B:
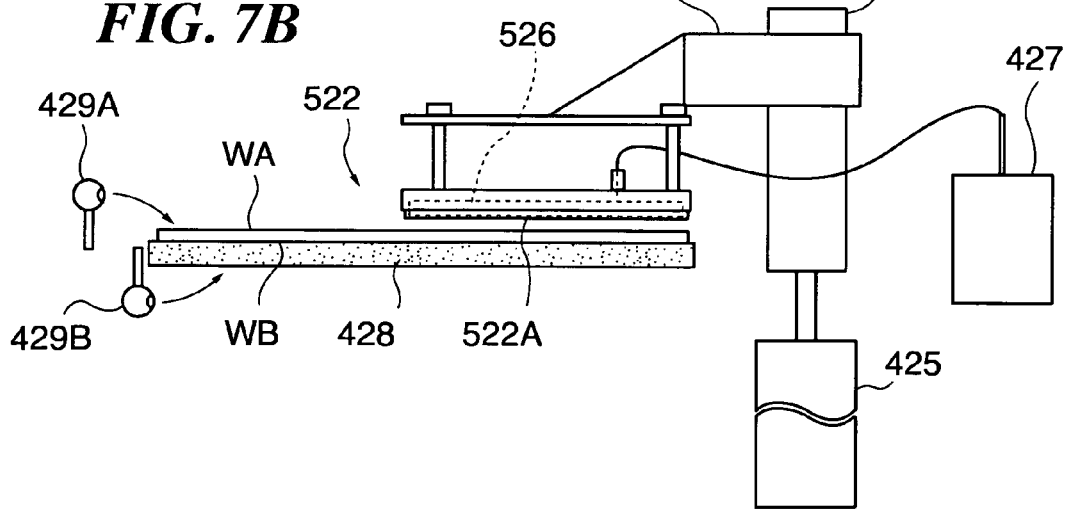
FIG. 7B is a side view of a modified example of the ultrasonic cleaner.

FIG. 7A is a perspective view of the ultrasonic cleaner 52, and FIG. 7B is a side view of the ultrasonic cleaner 52. The ultrasonic cleaner 52 includes: the rotary support members 421 for holding and rotating the substrate W, an ultrasonic emitter 522 for transmitting ultrasonic waves through liquid to the top surface WA of the substrate W, the roll sponge 428 for scrubbing the under surface WB of the substrate W, and the liquid supply nozzles 429A and 429B for supplying chemical liquid, pure water, etc. to the substrate W. The rotary support member 421, the roll sponge 428, and the liquid supply nozzles 429A and 429B are the same in constitution as those in the ultrasonic cleaner 42 (See FIG. 2); consequently, duplicate description is omitted.

The ultrasonic emitter 522 has an ultrasonic emitting surface 522A as the first surface formed in generally triangular shape and facing the top surface WA of the substrate W held with the rotary support members 421. The phrase 'generally triangular shape' means that the external appearance is generally in triangular shape; therefore, it includes the shape shown in FIG. 7A with an apex truncated, and the shape with one side of triangle is arcuate. Even if two or three sides of a triangle are arcuate, the shape is within the concept of generally triangular shape as long as the shape as a whole is recognized as a triangle.

The ultrasonic emitting surface 522A in this embodiment is formed in generally triangular shape, with the subtense of an apex arcuate. The ultrasonic emitting surface 522A is formed in a generally triangular shape, with the distance between one arcuate side and its opposite apex (in the case the apex is truncated, the short side) greater than the radius of the substrate W. The ultrasonic emitting surface 522A may be made of chemical-resistant material such as sapphire or ceramics. The ultrasonic emitter 522 has such an extent of vertical dimension that can form an internal space for holding a vibrating element 526 for giving vibration energy to the ultrasonic emitting surface 522A. The ultrasonic emitter 522 is formed so that the ultrasonic emitting surface 522A and the upper surface 522C are parallel to each other. The vertical distance between the ultrasonic emitting surface 522A and the upper surface 522C is the thickness of the ultrasonic emitter 522.

In the ultrasonic emitter 522, the vibrating element 526 is provided to give vibration energy to the ultrasonic emitting surface 522A. One surface of the vibrating element 526 in contact with the ultrasonic emitting surface 522A has generally the same area as the ultrasonic emitting surface 522A, and is adapted to give vibration energy evenly over the entire ultrasonic emitting surface 522A. The vibrating element 526 is typically formed of a constant thickness over the entire surface in contact with the ultrasonic emitting surface 522A; and is attached to the ultrasonic emitter 522 so that its surface (vibrating element surface) on the side of the ultrasonic emitting surface 522A (on the lower side in FIG. 7B) is parallel to the ultrasonic emitting surface 522A (including the state in which the vibrating element surface and the ultrasonic emitting surface 522A are on the same plane). The vibrating element 526 is typically a piezoelectric vibrating element and electrically connected to the oscillator 427. The oscillator 427 is of a self-exciting type and adapted to be capable of adjusting its output in the range of 5 to 100%. The vibrating element 526 transmits ultrasonic energy to the ultrasonic emitting surface 522A, and is preferably adapted to transmit megasonic energy of about 0.5 to 5.0 MHz. The upper surface 522C of the ultrasonic emitter 522 is preferably provided with a cooling gas nozzle (not shown) for supplying air, nitrogen, etc. to the interior of the ultrasonic emitter 522 to cool the vibrating element 526.

The ultrasonic emitter 522 is supported with an attachment member 523. In this embodiment, the attachment member 523 has three support rods extending vertically and attached to the upper surface 522C of the ultrasonic emitter 522, so as to support the ultrasonic emitting surface 522A in horizontal attitude. The attachment member 523 is attached to the attachment shaft 424. A vertically movable air cylinder 425 as a fluid pressure cylinder is disposed under the attachment shaft 424. The ultrasonic emitter 522 is adapted to be vertically movable by the vertical motion of the air cylinder 425 through the attachment shaft 424 and the attachment member 523. Thus, the ultrasonic emitter 522 may be moved toward and away from the substrate W. The ultrasonic emitter 522, when it moves toward the substrate W by the operation of the air cylinder 425, is positioned to cover the radius of the substrate W held with the rotary support members 421. As the ultrasonic emitting surface 522A is positioned to cover the radius of the substrate W, the entire surface of the substrate W may be cleaned simply by rotating the substrate W without moving the ultrasonic emitter 522. Further, as the ultrasonic emitting surface 522A is formed having an extended area, energy per unit area may be lowered, and it becomes easy to retain chemical liquid between the top surface WA of the substrate W and the ultrasonic emitting surface 522A; consequently, two purposes are attained simultaneously: reduction in damages to the substrate W and improvement in cleaning performance. Also with the ultrasonic cleaner 52, when cleaning the substrate W, the ultrasonic emitting surface 522A is disposed parallel to the top surface WA of the substrate W (Here, also the vibrating element surface of the vibrating element 526 is parallel to the top surface WA of the substrate W). The above constitution, along with the generally triangular shape of the ultrasonic emitting surface 522A, makes it possible to give vibration energy evenly to the entire top surface WA of the rotating substrate W. Incidentally, the air cylinder 425 may be replaced with a hydraulic cylinder (oil pressure cylinder). Employing the air cylinder can reduce shocks in operation; and hydraulic cylinder can facilitate downsizing. The ultrasonic emitter 522 described above is an embodiment of the ultrasonic emitter shown in FIG. 3A.

Continuously in reference to FIG. 7A and FIG. 7B, functions or operations of the ultrasonic cleaner 52 will be described. The substrate W sent through the transfer unit 46 (See FIG. 1) is held with the side faces of a plurality (six in this embodiment) of the rotary support members 421 and rotated at rotating speeds of about 5 to 80 rpm. Chemical liquid is supplied from the liquid supply nozzle 429A to the top surface WA of the substrate W. Subsequently, the ultrasonic emitter 522 is moved above the substrate W so that the distance between the ultrasonic emitting surface 522A and the top surface WA of the substrate W is about 0.5 to 4.0 mm and that the ultrasonic emitting surface 522A covers the radius of the substrate W.

When the ultrasonic emitter 522 is positioned as described above, a predetermined output of ultrasonic waves (megasonic energy) is outputted from the vibrating element 526 and transmitted from the ultrasonic emitting surface 522A through chemical liquid to the top surface WA of the substrate W, so that the top surface WA of the substrate W is cleaned with the ultrasonic waves. This ultrasonic cleaning is solid matter noncontact cleaning. Here, as the rotating speed of the substrate W is made to about 5 to 80 rpm, it is possible to retain liquid film between the ultrasonic emitter 522 and the top surface WA of the substrate W. Besides, as the ultrasonic emitting surface 522A is formed in generally triangular shape, it is possible to give vibration energy evenly to the entire top surface WA of the rotating substrate W. In the ultrasonic cleaning, as it is possible to start the cleaning immediately after positioning the ultrasonic emitter 522, initializing time becomes unnecessary. Cleaning the top surface WA of the substrate W with a predetermined output of ultrasonic waves as described above makes it possible to remove dust for example in the recesses, formed in the top surface WA of the substrate W, necessary for positioning in manufacturing semiconductor devices, of widths of 2.0 micrometers or smaller and predetermined widths or greater (about 0.5 micrometers or greater) determined by the type of semiconductor device manufacturing apparatus, or dust in the recesses of widths of about 10 to 50 nm and depths of about 10 to 100 nm formed in the process of polishing the top surface WA of the substrate W. In particular, cleaning the top surface WA of the substrate W with ultrasonic waves of the ultrasonic emitter 522 having the ultrasonic emitting surface 522A makes it possible to retain liquid film between the ultrasonic emitting surface 522A and the surface of the substrate W and effectively remove dust present in the recesses described above.

While the ultrasonic cleaning described above is being carried out, the under surface WB of the substrate W is cleaned by supplying chemical liquid from the liquid supply nozzle 429B to the under surface WB of the substrate W along with pressing the roll sponge 428 with a predetermined force against the under surface WB of the substrate W, and rotating the roll sponge 428. When the ultrasonic cleaning of the top surface WA of the substrate W and cleaning of the under surface WB of the substrate W with the roll sponge 428B are carried out for a predetermined period of time, the ultrasonic emitter 522 and the roll sponge 428 are removed from the substrate W, the rotating speed of the substrate W is increased to about 100 to 150 rpm; pure water, etc. is supplied from the liquid supply nozzles 429A and 429B to both the surfaces of the substrate W to rinse them. After the rinse, the substrate W is delivered through the transfer unit 46 (See FIG. 1) to the roll cleaner 43 (See FIG. 1). Incidentally, the cleaning of the under surface WB of the substrate W with the roll sponge 428 may be carried out after cleaning the top surface WA of the substrate W with the ultrasonic waves of the ultrasonic emitter 422.

Example 1

In the Example 1, the cleaning section 4 of the substrate processing apparatus 100 (See FIG. 1) was constituted by disposing components in the order of: the ultrasonic cleaner 42 (See FIG. 2), the roll cleaner 43 (See FIG. 4), the first two-fluid jet cleaner 44 (See FIG. 5), and the second two-fluid jet cleaner 44 (See FIG. 5), from the upstream to downstream side. The substrate W to be processed in the Example 1 was one with its top surface WA having grooves formed according to wiring pattern, a silicon dioxide ($SiO_2$) film, and a titanium nitride (TiN) film as barrier metal; over which a tungsten film was formed. This substrate W was polished by a predetermined depth in the polishing section 3, so that $SiO_2$, TiN, and tungsten appeared on the top surface WA of the substrate W. The top surface WA of the substrate W was adapted to have an alignment mark, remaining after being polished, used for example for positioning in manufacturing semiconductor devices; with the alignment mark made up of two grooves, each about 0.5 micrometers wide, 0.5 micrometers deep, and 5 micrometers long, crossing each other at right angles.

The above substrate W after being polished was transferred to the ultrasonic cleaner 42, held with the rotary support member 421, and rotated at a rotating speed of 30 rpm. Then, aqueous solution of ammonium hydroxide ($NH_4OH$) of 1 weight % was started being supplied at a flow rate of 600 milliliters/min from the liquid supply nozzle 429A to the top surface WA of the substrate W. The ultrasonic emitter 422 was positioned so that the distance between the emitting surface 422A and the top surface WA of the substrate W was about 1.5 mm, and emission of ultrasonic waves was started with an output of 30 W. At the same time, cleaning of the under surface WB of the substrate W was started by pressing the roll sponge 428 with a pressure of about 6N against the under surface WB of the substrate W, rotating the roll sponge 428 at a rotating speed of 100 rpm, and supplying $NH_4OH$ aqueous solution of 1 weight % at a flow rate of 600 milliliters/min. This cleaning of the substrate W with ultrasonic waves was continued for 30 seconds when the supply of $NH_4OH$ to both the surfaces WA and WB of the substrate W was stopped, the ultrasonic emitter 422 was removed to a position where the emitting surface 422A was 50 mm above the substrate W and the roll sponge 428 was retracted to a retracted position, to end the ultrasonic cleaning.

After finishing the ultrasonic cleaning above, the rotating speed of the substrate W remaining held with the rotary support member 421 was increased to 100 rpm, and both the surfaces WA and WB of the substrate W were rinsed for 15 seconds by supplying deionized water (DIW) at a flow rate of 600 milliliters/min to both the surfaces. With the ultrasonic cleaner 42 as described above, particles adhering to the recesses and the top surface WA of the substrate W was removed by ultrasonic waves. After finishing the rinse, the substrate W was stopped rotating and transferred to the roll cleaner 43.

With the roll cleaner 43, first the substrate W was held with the rotary support members 431 and rotated at a rotating speed of 100 rpm. Then, both the surfaces WA and WB of the substrate W were scrub-cleaned by supplying aqueous solution of 0.5 weight % of hydrogen fluoride (HF) at a flow rate of 600 milliliters/min from the liquid supply nozzles 436A and 436B to both the surfaces WA and WB of the substrate W and at the same time, pressing the roll sponges 432 and 434 against both the surfaces WA and WB of the substrate W with a force of about 6 N and rotating the roll sponges 432 and 434 at a rotating speed of 100 rpm. After carrying out the scrub cleaning for 15 seconds, supply of HF to both the surfaces WA and WB of the substrate W was stopped, and the roll sponges 432 and 434 were removed to the retracted position to end the scrub cleaning.

After finishing the scrub cleaning, while maintaining the rotating speed of the substrate W at 100 rpm, both the surfaces WA and WB of the substrate W were rinsed by supplying deionized water at a flow rate of 600 milliliters/min to both the surfaces WA and WB for 15 seconds. In this way, with the roll cleaner 43, particles were removed by scrub cleaning while metallic contamination was cleaned by the effect of etching the oxide film with HF. After finishing the rinse, the substrate W was stopped rotating and transferred to the first two-fluid jet cleaner 44.

With the first two-fluid jet cleaner 44, first the substrate W was held with the chuck claws 441a of the rotary chuck 441 and rotated at a rotating speed of 500 rpm. Both the surfaces WA and WB of the substrate W were cleaned for 15 seconds with chemical liquid, aqueous solution of 1 weight % of $NH_4OH$ supplied from the liquid supply nozzles 446A and 446B at a flow rate of 600 milliliters/min to both the surfaces WA and WB. After the chemical liquid cleaning, supply of $NH_4OH$ was stopped and two-fluid jet cleaning was carried out while maintaining a rotating speed of 500 rpm. The two-fluid jet cleaning was carried out by positioning the tip of the two-fluid nozzle 442 at 5 mm above the center of the top surface WA of the substrate W, supplying nitrogen gas at 50 liters/min through the gas inflow passage 442a, supplying aqueous solution of carbon dioxide at 0.2 liters/min through the liquid inflow passage 442b, so that the mist M of the two fluids mixed together was spouted from the mist spray outlet 442h, and moving the two-fluid nozzle 442 between the substrate W's center and a position 1 mm inward from the periphery of the substrate W for one back-and-forth cycle at a speed of 20 mm/s.

After finishing the two-fluid jet cleaning, while maintaining the rotating speed of the substrate W at 500 rpm, both the surfaces WA and WB of the substrate W were rinsed with deionized water supplied at a flow rate of 600 milliliters/min to both the surfaces for 15 seconds. In this way with the two-fluid jet cleaner 44, very small amount of particles left in the recesses and the top surface WA of the substrate W during the scrub cleaning with the roll cleaner 43 was removed. After finishing the rinse, the rotation of the substrate W was stopped and the substrate W was transferred to the second two-fluid jet cleaner 44.

With the second two-fluid jet cleaner 44, first the substrate W was held with the chuck claws 441a of the rotary chuck 441 and rotated at a rotating speed of 500 rpm, and deionized water was supplied through the liquid supply nozzles 446A and 446B to both the surfaces WA and WB of the substrate W at a flow rate of 600 milliliters/min to rinse both the surfaces for 10 seconds. After finishing the rinse, the supply of deionized water was stopped, and the rotating speed of the substrate W was raised to 1500 rpm to spin-dry the substrate W for 30 seconds. In this way, the second two-fluid jet cleaner 44 was used as a spin dryer in the Example 1. After finishing drying, the substrate W was stowed in the wafer cassette 20 using the transfer robot 22.

With the Example 1, it was possible to clean the recesses and remove particles coming out of the roll sponge material itself, which had been impossible by only the scrub cleaning with the conventional roll cleaner, and clean the top surface WA of the substrate W including the recesses. Incidentally, it was also possible to clean the top surface WA of the substrate W including the recesses as in the Example 1 described above, by modifying the Example 1 such that the first two-fluid jet cleaner 44 was replaced with the ultrasonic cleaner 42 to carry out ultrasonic cleaning and rinsing in like manner as with the first ultrasonic cleaner 42 after the scrub cleaning with the roll cleaner 43. Also with a modification of the Example 1 in which the ultrasonic cleaner 42 was replaced with the two-fluid jet cleaner 44, it was possible to clean the top surface WA of the substrate W including the recesses like in the Example 1 by carrying out, before the scrub cleaning with the roll cleaner 43, chemical liquid cleaning, two-fluid jet cleaning, and rinse in the same manner as with the first two-fluid jet cleaner 44 before the modification.

Example 2

In the Example 2, the cleaning section 4 of the substrate processing apparatus 100 (See FIG. 1) was constituted by disposing components in the order of: the first ultrasonic cleaner 42 (See FIG. 2), the second ultrasonic cleaner 42 (See FIG. 2), the first two-fluid jet cleaner 44 (See FIG. 5), and the second two-fluid jet cleaner 44 (See FIG. 2) from the upstream to downstream side. The substrate W to be processed in the Example 2 was made the same as that used in the Example 1 (substrate with $SiO_2$ film plus TiN film plus tungsten film). This substrate W was polished by a predetermined amount in the polishing section 3, so that $SiO_2$, TiN, and tungsten appeared on the top surface WA of the substrate W. Here, the top surface WA of the substrate W was adapted like that in the Example 1 to have an alignment mark, remaining after being polished; with the alignment mark made up of two grooves, each about 0.5 micrometers wide, 0.5 micrometers deep, and 5 micrometers long, crossing each other at right angles.

The substrate W after the above polishing was transferred to the first ultrasonic cleaner 42 and cleaned with ultrasonic waves and rinsed in the same manner as with the ultrasonic cleaner 42 in the Example 1. After finishing the ultrasonic cleaning and the rinse with the first ultrasonic cleaner 42, the substrate W was transferred to the second ultrasonic cleaner 42, and cleaned with ultrasonic waves and rinsed in the same manner as with the first ultrasonic cleaner 42 (or in the same manner as the ultrasonic cleaning and the rinse with the ultrasonic cleaner 42 in the Example 1). In this way, particles present in the recesses and on the top surface WA of the substrate W were removed by ultrasonic cleaning using the first and second ultrasonic cleaners 42. Carrying out the ultrasonic cleaning in two stages in different places reduced the possibility of particles adhering again in the cleaner of the latter stage. After rinsing with the second ultrasonic cleaner 42, the substrate W was transferred to the first two-fluid jet cleaner 44.

With the first two-fluid jet cleaner 44, first the substrate W was held with the chuck claws 441a of the rotary chuck 441 and rotated at a rotating speed of 500 rpm, and cleaned with chemical liquid by supplying aqueous solution of 0.5 weight % of HF through the liquid supply nozzles 446A and 446B at a flow rate of 600 milliliters/min for 15 seconds. After the chemical liquid cleaning, both the surfaces WA and WB of the substrate W were rinsed with deionized water supplied at a flow rate of 600 milliliters/min while maintaining the rotating speed of the substrate W at 500 rpm for 15 seconds. In this way, in the first two-fluid jet cleaner 44, chemical liquid was used to clean metallic contamination. In the Example 2, the first two-fluid jet cleaner 44 was used as a chemical liquid cleaner. After finishing the rinse, rotation of the substrate W was stopped, and the substrate W was transferred to the second two-fluid jet cleaner 44.

With the second two-fluid jet cleaner 44, the substrate W was rinsed and spin-dried in the same manner as with the second two-fluid jet cleaner 44 in the Example 1. That is, also in the Example 2, the second two-fluid jet cleaner 44 was used as a spin dryer. After finishing drying, the substrate W was stowed in the wafer cassette 20 through the transfer robot 22.

With the Example 2, it was possible to clean the recesses, which had been impossible by only the scrub cleaning using the conventional roll cleaner, and to clean the top surface WA of the substrate W including the recesses. Also the Example 2 made it possible, as it did not scrub-clean the top surface WA of the substrate W with the roll cleaner 43, that the rise time of the roll sponge was unnecessary; accordingly, effects of reduced processing time and reduced consumption material costs were obtained. Incidentally, when the first and second ultrasonic cleaners 42 were replaced with two-fluid jet cleaners 44 respectively and chemical liquid cleaning and rinse were carried out with the first and second two-fluid jet cleaners 44 after the replacement in the same manner as with the first two-fluid jet cleaner 44 before the replacement, it was possible to clean the top surface WA of the substrate W including the recesses like with the Example 2 above, and effects of reduced processing time and reduced consumption material costs were obtained.

Example 3

In the Example 3, the cleaning section 4 of the substrate processing apparatus 100 (See FIG. 1) was constituted by disposing components in the order of: the first ultrasonic cleaner 42 (See FIG. 2), the second ultrasonic cleaner 42 (See FIG. 2), the first two-fluid jet cleaner 44 (See FIG. 5), and the second two-fluid jet cleaner 44 (See FIG. 5), from the upstream to downstream side. The substrate W to be processed in the Example 3 was one with its top surface WA having grooves formed according to the wiring pattern, an $SiO_2$ film, and a tantalum nitride (TaN) film as barrier metal; over which a copper (Cu) film was formed. First, the Cu film on the substrate W was polished down to the highest level of the TaN film (excluding the TaN film in the grooves matching the wiring pattern) on the top surface WA of the substrate W. Next, the substrate W was moved to the polishing device 30B to polish by 10 nm the TaN film on the highest level of the top surface WA of the substrate W and the oxide film formed below the TaN film. The top surface WA of the substrate W after the polishing was formed with recesses (for example 20 nm wide and 30 nm deep) between the TaN and the embedded Cu.

The substrate W after the polish was transferred to the first ultrasonic cleaner 42 and cleaned with ultrasonic waves and rinsed in the same manner as in the ultrasonic cleaning with the ultrasonic cleaner 42 in the Example 1. However, the chemical liquid supplied to both the surfaces WA and WB of the substrate W in ultrasonic cleaning was not $NH_4OH$ but one containing surface active agent that controls the zeta potential of particles, Cu surface, and insulator film ($SiO_2$ in this embodiment) to be the same polarity and chelating agent that restricts metallic contamination by metal collecting effect (hereinafter called the "cleaning liquid for Cu"). Other cleaning liquids prepared for Cu may also be used. The supply flow rate is the same as in the Example 1. After finishing ultrasonic cleaning and rinse with the first ultrasonic cleaner 42, the substrate W was transferred to the second ultrasonic cleaner 42 and cleaned with the ultrasonic waves and rinsed in the same manner as the ultrasonic cleaning and rinse with the first ultrasonic cleaner 42 (or, in the same manner as the ultrasonic cleaning and rinse with the ultrasonic cleaner 42 in the Example 1, except for the chemical liquid used in the ultrasonic cleaning). In this way, the first and second ultrasonic cleaners 42 were used to remove particles adhering to the recesses and the top surface WA of the substrate W by ultrasonic cleaning. Carrying out the ultrasonic cleaning in two stages in different places reduced the possibility of particles adhering again in the cleaner of the latter stage. After rinsing with the second ultrasonic cleaner 42, the substrate W was transferred to the first two-fluid jet cleaner 44.

With the first two-fluid jet cleaner 44, the substrate W was cleaned with chemical liquid, two-fluid jet, and rinsed in the same manner as in the two-fluid jet cleaning with the first two-fluid jet cleaner 44 in the Example 1. However, the chemical liquid supplied to both the surfaces WA and WB of the substrate W in the chemical liquid cleaning was not $NH_4OH$ but a cleaning liquid for Cu (at the same supply flow rate as in the Example 1), and the flow rate of nitrogen gas supplied to the gas inflow passage 442a in the two-fluid jet cleaning was made 100 liters/min. Other conditions were the same as those for the first two-fluid jet cleaner 44 in the Example 1. In this way, the first two-fluid jet cleaner 44 was used to remove particles from the recesses and the top surface WA of the substrate W. After finishing the rinse, rotation of the substrate W was stopped and the substrate W was transferred to the second two-fluid jet cleaner 44.

With the second two-fluid jet cleaner 44, the substrate W was rinsed and spin-dried in the same manner as in the two-fluid jet cleaning with the second two-fluid jet cleaner 44 in the Example 1. That is, also in the Example 3, the second two-fluid jet cleaner 44 was used as a spin dryer. After finishing the drying, the substrate W was stowed in the wafer cassette 20 by means of the transfer robot 22.

With the Example 3, it was possible to clean the recesses, which had been impossible by only the scrub cleaning with the conventional roll cleaner, and to clean the top surface WA of the substrate W including the recesses. Also the Example 3 made it possible, as it did not scrub-clean the top surface WA of the substrate W with the roll cleaner 43, that the rise time of the roll sponge was unnecessary; accordingly, effects of reduced processing time and reduced consumption material costs were obtained. Incidentally, also in the case the Example 3 was modified by replacing three cleaners, other than the second two-fluid jet cleaner 44 (fourth cleaner in the cleaning section 4), with any three chosen from the ultrasonic cleaner 42 and the two-fluid jet cleaner 44 in arbitrary order and the substrate W was cleaned with respective cleaners in the same manner as in the Example 3, it was possible, like in the Example 3, to make clean the recesses and the top surface WA of the substrate W and to obtain the effects of reduced processing time and reduced consumption material costs.

Example 4

In the Example 4, the cleaning section 4 of the substrate processing apparatus 100 (See FIG. 1) was constituted by disposing components in the order of: the ultrasonic cleaner 52 (See FIG. 7), the roll cleaner 43 (See FIG. 4), the two-fluid jet cleaner 44 (FIG. 5), and the cleaner/dryer 45 (See FIG. 6) from the upstream to downstream side. The substrate W to be processed in the Example 4 was a test substrate W made of silicon (Si), of 300 mm in diameter, covered with a PTEOS (plasma tetra ethyl oxysilane) film of about 1000 nm, with no wiring patterns formed. This substrate W was polished in the polishing section 3 for 20 seconds using oxidized film polishing agent containing dispersed polishing grains of silicon dioxide ($SiO_2$), brought into the cleaning section 4, and cleaned. The constitution of the apparatus and the substrate W to be processed used in this Example 4 were also used in the Example 5 and a Comparative Example described later.

The substrate W, after being polished as described above, was transferred to the ultrasonic cleaner 52, and rotated at a rotating speed of 30 rpm while being held with the rotary support members 421. Supply of aqueous solution of 1 weight % of ammonium hydroxide ($NH_4OH$) to the top surface WA of the substrate W was started at a flow rate of 1000 milliliters/min through the liquid supply nozzle 429A. The ultrasonic emitter 522 was positioned so that the distance between the ultrasonic emitting surface 522A and the top surface WA of the substrate W was about 1.5 mm, and ultrasonic waves were started to be cast at an output of 200 W. Simultaneously with the above, the roll sponge 428 was pressed against the under surface WB of the substrate W with a pressing force of about 6 N, and the roll sponge 428 was rotated at a rotating speed of 100 rpm, and supply of aqueous solution of 1 weight % of $NH_4OH$ at a flow rate of 600 milliliters/min to the under surface WB of the substrate W was started to clean the under surface WB. After running this ultrasonic cleaning of the substrate W for 15 seconds, the supply of $NH_4OH$ to both the surfaces WA and WB of the substrate W was stopped, the ultrasonic emitter 522 was brought to the position in which the ultrasonic emitting surface 522A was 50 mm above the substrate W, and the roll sponge 428 was moved to the retracted position, to end the ultrasonic cleaning.

After finishing the ultrasonic cleaning above, the rotating speed of the substrate W, remaining held with the rotary support members 421, was raised to 100 rpm; both the surfaces WA and WB of the substrate W were rinsed by supplying deionized water (DIW) to both the surfaces WA and WB at a flow rate of 600 milliliters/min for about 8 seconds. In this way with the ultrasonic cleaner 52, particles adhering to the top surface WA of the substrate W were removed by the ultrasonic cleaning. After finishing the rinse, rotation of the substrate W was stopped and the substrate W was transferred to the roll cleaner 43.

In the roll cleaner 43, first the substrate W was held with the rotary support members 431 and rotated at a rotating speed of 100 rpm. Then, both the surfaces WA and WB of the substrate W were scrub-cleaned by supplying aqueous solution of 0.5 weight % of hydrogen fluoride (HF) at a flow rate of 600 milliliters/min through the liquid supply nozzles 436A and 436B, while pressing the roll sponges 432 and 434 against both the surfaces WA and WB of the substrate W with a pressing force of about 6 N and rotating the roll sponges 432 and 434 at a rotating speed of 100 rpm. After carrying out the scrub cleaning for 15 seconds, the supply of HF to both the surfaces WA and WB of the substrate W was stopped.

After stopping the supply of HF, the substrate W was rinsed, while pressing the roll sponges 432 and 434 against both the surfaces WA and WB of the substrate W with a pressing force of about 6 N, and maintaining the rotating speed of the substrate W and the rotating speed of the roll sponges 432 and 434 at 100 rpm, and supplying deionized water at a flow rate of 600 milliliters/min to both the surfaces WA and WB of the substrate W. The rinse was made for about 8 seconds. In this way with the roll cleaner 43, particles were removed by the scrub cleaning while metallic contamination was cleaned by the effect of etching the oxidation film with HF. After finishing the rinse, the roll sponges 432 and 434 were removed to the retracted position, rotation of the substrate W was stopped, and the substrate W was transferred to the two-fluid jet cleaner 44.

With the two-fluid jet cleaner 44, first, the substrate W was heldwith the chuck claws 441a of the rotary chuck 441 and rotated at a rotating of 500 rpm, and cleaned with chemical liquid of aqueous solution of 1 weight % of $NH_4OH$ supplied at a flow rate of 600 milliliters/min through the liquid supply nozzles 446A and 446B to both the surfaces WA and WB of the substrate W for 5 seconds. After the chemical liquid cleaning, the supply of $NH_4OH$ was stopped, and two-fluid jet cleaning was carried out while maintaining a rotating speed of 500 rpm. The two-fluid jet cleaning was carried out, with the tip of the two-fluid nozzle 442 positioned at 8 mm above the center of the top surface WA of the substrate W, by supplying nitrogen gas at 100 milliliters/min through the gas inflow passage 442a, supplying aqueous solution of carbon dioxide at 0.2 milliliters/min through the liquid inflow passage 442b, so that the mist M of the two fluids mixed together was spouted from the mist spray outlet 442h, and moving the two-fluid nozzle 442 between the substrate W's center and a position 1 mm inward from the periphery of the substrate W for one back-and-forth cycle at a speed of 30 mm/s.

After finishing the two-fluid jet cleaning, the substrate W, with its rotating speed maintained at 500 rpm, was rinsed by supplying deionized water at a flow rate of 600 milliliters/min to both the surfaces WA and WB of the substrate W for 5 seconds. In this way, with the two-fluid jet cleaner 44, very small amount of particles that adhered during the scrub cleaning with the roll cleaner 43 was removed from the top surface WA of the substrate W. After finishing the rinse, rotation of the substrate W was stopped and the substrate W was transferred to the cleaner/dryer 45.

With the cleaner/dryer 45, both the surfaces WA and WB of the substrate W were spin-dried by holding the substrate W with the chuck claws 451a of the rotary chuck 451 and rotating the substrate W at a rotating speed of 1500 rpm for about 20 seconds to fling off liquid droplets adhering to both the surfaces WA and WB of the substrate W. Spin-drying the substrate W with the cleaner/dryer 45 made it possible to prevent liquid droplets adhering to the substrate W from evaporating and accordingly prevent watermarks, which would cause damages to the substrate W, from appearing. After finishing the drying, the substrate W was stowed in the wafer cassette 20 through the transfer robot 22. Results of cleaning the substrate W in the Example 4 will be described later.

Example 5

In the Example 5, as described above, the substrate processing apparatus 100 (See FIG. 1) and the test substrate W of the same constitution as used in the Example 4 were used. In the Example 5, the substrate W after being polished as described above was passed through the ultrasonic cleaner 52 (that is, without being processed with the ultrasonic cleaner 52), transferred to the roll cleaner 43, and scrub-cleaned and rinsed in the same manner as the scrub cleaning with the roll cleaner 43 in the Example 4. After finishing scrub cleaning and rinse with the roll cleaner 43, the substrate W was transferred to the two-fluid jet cleaner 44, cleaned with chemical liquid, cleaned with two-fluid jet, and rinsed in the same manner as in the two-fluid jet cleaning with the two-fluid jet cleaner 44 in the Example 4. After finishing the chemical liquid cleaning, two-fluid jet cleaning, and rinse with the two-fluid jet cleaner 44, the substrate W was transferred to the cleaner/dryer 45, and spin-dried in the same manner as drying with the cleaner/dryer 45 in the Example 4. After finishing drying, the substrate W was stowed in the wafer cassette 22 through the transfer robot 22. Results of cleaning the substrate W in the Example 5 will also be described later.

Comparative Example

In the Comparative Example, as described above, the substrate processing apparatus 100 (See FIG. 1) and the test substrate W of the same constitution as used in the Example 4 were used. In the Comparative Example, the substrate W after the polishing as described above was passed through the ultrasonic cleaner 52 (that is, without being processed with the ultrasonic cleaner 52), transferred to the roll cleaner 43, and scrub-cleaned and rinsed in the same manner as the scrub cleaning with the roll cleaner 43 in the Example 4. After finishing scrub cleaning and rinse with the roll cleaner 43, the substrate W was passed through the two-fluid jet cleaner 44 (that is, without being processed with the two-fluid jet cleaner 44), transferred to the cleaner/dryer 45, and spin-dried in the same manner as in the drying with the cleaner/dryer 45 in the Example 4. After finishing drying, the substrate W was stowed in the wafer cassette 22 through the transfer robot 22.

Figure 8:
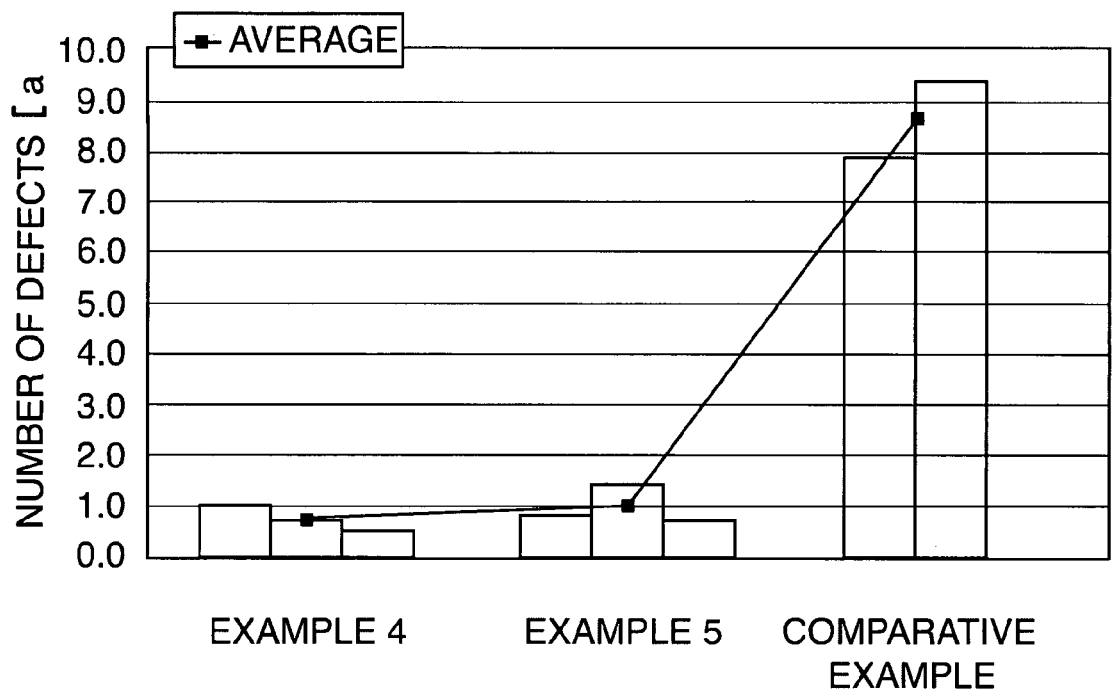
FIG. 8 is a graph showing the results of substrate cleaning in Examples 4 and 5 and a Comparative Example.

FIG. 8 is a graph showing the results of cleaning the substrate W in the Example 4, the Example 5, and the Comparative Example. The vertical axis of the graph in FIG. 8 shows the number of defects (foreign matter and scars present on the substrate W) on the substrate W after cleaning. The line graph in FIG. 8 shows the average of the number of defects counted for several times for the Examples 4 and 5 and the Comparative Example. The number of defects indicated along the vertical axis of FIG. 8 is the relative value when the average of the number of defects in the Example 5 is assumed to be reference (=1). The results shown in FIG. 8 is the number of defects counted with a dark field defect inspection instrument (IS2700, of Hitachi High Technologies, Inc. make) with its inspection sensitivity adjusted to detect PSL particle sizes of 0.15 micrometers or greater. As seen in the graph of FIG. 8, the number of defects in the Examples 4 and 5 is remarkably small when compared with the Comparative Example. That is, carrying out cleaning with the two-fluid jet cleaner 44, or cleaning with the ultrasonic cleaner 52 and the two-fluid jet cleaner 44, in addition to cleaning with the roll cleaner 43, has proved to improve drastically the cleaning level of the substrate W.

The invention claimed is:
1. A substrate processing apparatus comprising:
a polishing device for polishing a surface of a substrate;
an ultrasonic cleaning device for cleaning the surface of the substrate with ultrasonic waves transmitted through a liquid; and a two-fluid jet cleaning device for cleaning the surface of the substrate with a two-fluid jet spouted as a mixture of a gas and a liquid, wherein the ultrasonic cleaning device includes an ultrasonic cleaning rotating mechanism for holding and rotating the substrate in a horizontal plane, the two-fluid jet cleaning device includes a two-fluid jet cleaning rotating mechanism for holding and rotating the substrate in a horizontal plane, and the substrate processing apparatus further comprises a control device for controlling the ultrasonic cleaning rotating mechanism and the two-fluid jet cleaning rotating mechanism so that a rotating speed of the substrate being cleaned with the ultrasonic waves is lower than that of the substrate being cleaned with the two-fluid jet.

2. The substrate processing apparatus as recited in claim 1, wherein the ultrasonic cleaning device includes an ultrasonic emitter covering a radius of the substrate.

3. The substrate processing apparatus as recited in claim 2, wherein the ultrasonic emitter includes a first surface disposed to face the surface of the substrate and cover the radius of the substrate, a second surface attached with a vibrating element for producing the ultrasonic waves, and a third surface adjacent to the first and second surfaces, wherein the first, second, and third surfaces form a generally triangular column.

4. The substrate processing apparatus as recited in claim 2, wherein the ultrasonic emitter includes an ultrasonic emitting surface disposed to face the surface of the substrate and cover the radius of the substrate, and the ultrasonic emitting surface is formed in a generally triangular shape.

5. The substrate processing apparatus as recited in claim 2, wherein the ultrasonic emitter includes a first surface disposed to face the surface of the substrate and cover the radius of the substrate, and a vibrating element for producing the ultrasonic waves disposed either on the first surface or in a position more distant from the surface of the substrate to the vibrating element than from the surface of the substrate to the first surface, and a vibrating element surface of the vibrating element nearest to the surface of the substrate is in parallel with the surface of the substrate.

6. The substrate processing apparatus as recited in claim 2, further comprising:
a scrub cleaning device for cleaning the surface of the substrate by scrubbing the surface of the substrate with a scrubbing piece.

7. The substrate processing apparatus as recited in claim 1, further comprising:
a scrub cleaning device for cleaning the surface of the substrate by scrubbing the surface of the substrate with a scrubbing piece.

8. A method of processing a substrate with a substrate processing apparatus which includes a polishing device, an ultrasonic cleaning device having an ultrasonic cleaning rotating mechanism, a two-fluid jet cleaning device having a two-fluid jet cleaning rotating mechanism, and a control device, said method comprising:

polishing a surface of the substrate with the polishing device;

performing solid matter noncontact cleaning of the surface of the substrate while keeping the surface of the substrate in contact with a fluid, wherein said performing of the solid matter noncontact cleaning includes performing ultrasonic cleaning with the ultrasonic cleaning device by casting ultrasonic waves over an area covering a radius of the substrate while rotating the substrate in a horizontal plane, and performing two-fluid jet cleaning with the two-fluid jet cleaning device by spraying a mist, spouted as a mixture of a gas and a liquid, to the substrate while rotating the substrate in a horizontal plane; and controlling the ultrasonic cleaning rotating mechanism and the two-fluid jet cleaning rotating mechanism with the control device so that a rotating speed of the substrate while being cleaned with said ultrasonic cleaning is lower than that of the substrate while being cleaned with said two-fluid jet cleaning.

9. The method as recited in claim 8, further comprising:
cleaning the surface of the substrate by scrubbing the surface of the substrate with a scrubbing piece,
wherein said cleaning of the surface by scrubbing is followed by said performing of solid matter noncontact cleaning.

10. The method as recited in claim 8, wherein the substrate is formed with a recess with a width between 0.5 micrometers and 2.0 micrometers.

11. The method as recited in claim 8, wherein the substrate is formed with a recess with a width between 10 nanometers and 50 nanometers and with a depth between 10 nanometers and 100 nanometers.

* * * * *